United States Patent [19]

Rutherford et al.

[11] Patent Number: 4,679,094
[45] Date of Patent: Jul. 7, 1987

[54] METHOD FOR COMPRESSION AND TRANSMISSION OF VIDEO INFORMATION

[75] Inventors: David G. Rutherford, North Caldwell; Alain Regnault, Westfield; John Kirlick, River Vale, all of N.J.

[73] Assignee: The Associated Press, East Brunswick, N.J.

[21] Appl. No.: 918,848

[22] Filed: Oct. 14, 1986

[51] Int. Cl.[4] .......................................... H04H 1/419
[52] U.S. Cl. .................................... 358/261; 358/282
[58] Field of Search ............... 358/260, 261, 280, 282, 358/284

[56] References Cited

U.S. PATENT DOCUMENTS

| 4,568,983 | 2/1986 | Bobick | 358/261 |
| 4,573,201 | 2/1986 | Hashiyama | 358/261 |
| 4,599,656 | 7/1986 | Bellinghausen | 350/261 |

Primary Examiner—Edward L. Coles, Sr.
Attorney, Agent, or Firm—Arthur L. Lessler

[57] ABSTRACT

A facsimile transmitter capable of transmitting graphic as well as text material, by telephone or wireless. A digital code derived from scanning the document to be transmitted is truncated from eight bits per pixel to six bits per pixel. The three most significant bits of each pixel are run length encoded in eight bit bytes, so that wherever the same three most significant bits appear in adjacent pixels, these three bits are transmitted once, followed by a five bit code indicating the number of times (up to 32 times) the same three most significant bits are repeated in succeeding pixels. The resulting eight bit bytes are similarly run length encoded, so that the transmission of the three most significant bits of each pixel is double run length encoded. An eight bit fine resolution byte is transmitted for each eight pixels. The fine resolution bytes are encoded so that, in conjunction with the double run length encoded three most significant bits of each pixel, (i) the entire six bits of one-fourth of the pixels, (ii) the most significant four bits of one-fourth of the pixels, intermediate between the six-bit pixels, and (iii) only the three most significant bits of one-half of the pixels, each disposed between a six bit pixel and a four bit pixel, are transmitted. At the receiving end the pixels having four bits are expanded to eight bits by averaging the values of the preceding and succeeding pixels for which six bits were transmitted. Then the pixels having three bits are expanded to eight bits by averaging the values of the immediately preceding and immediately following pixels. Each transmitted scanned line contains an error detecting code. When an error is detected in a scanned line at the receiving end, the pixels of that line are replaced by the average of the corresponding pixels of the immediately preceding and succeeding lines.

12 Claims, 15 Drawing Figures

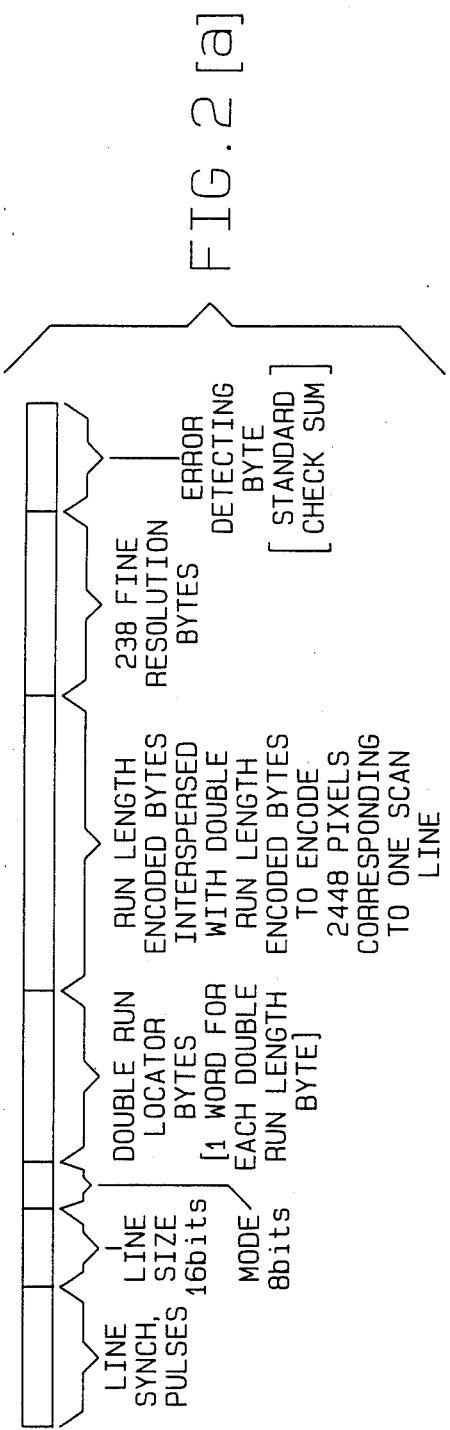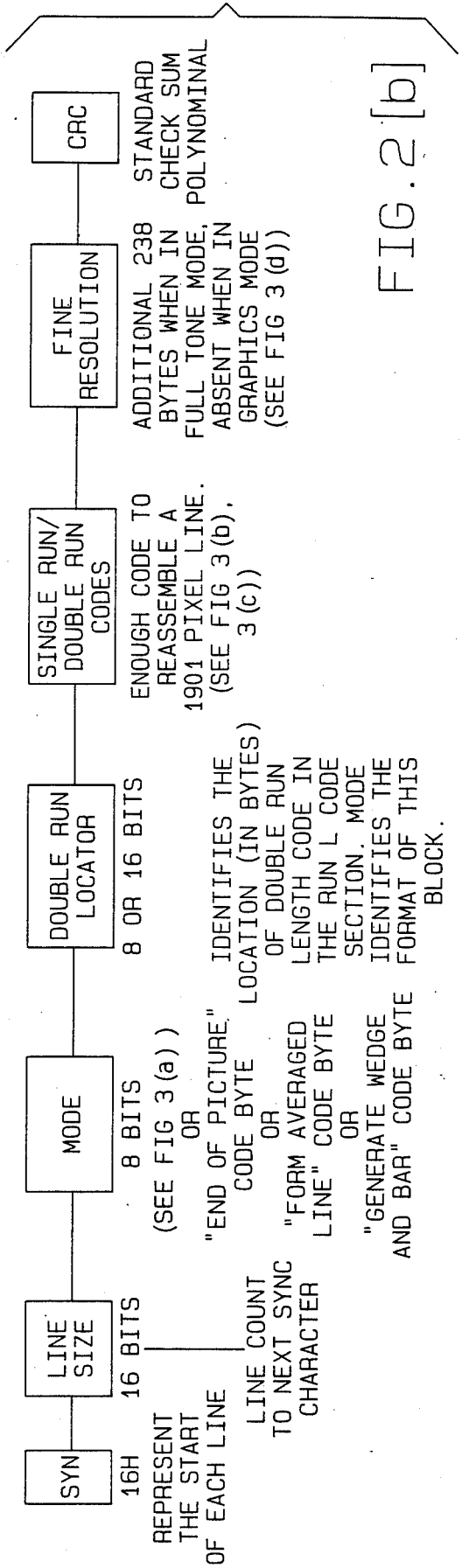
FIG. 2 [a]
FIG. 2 [b]

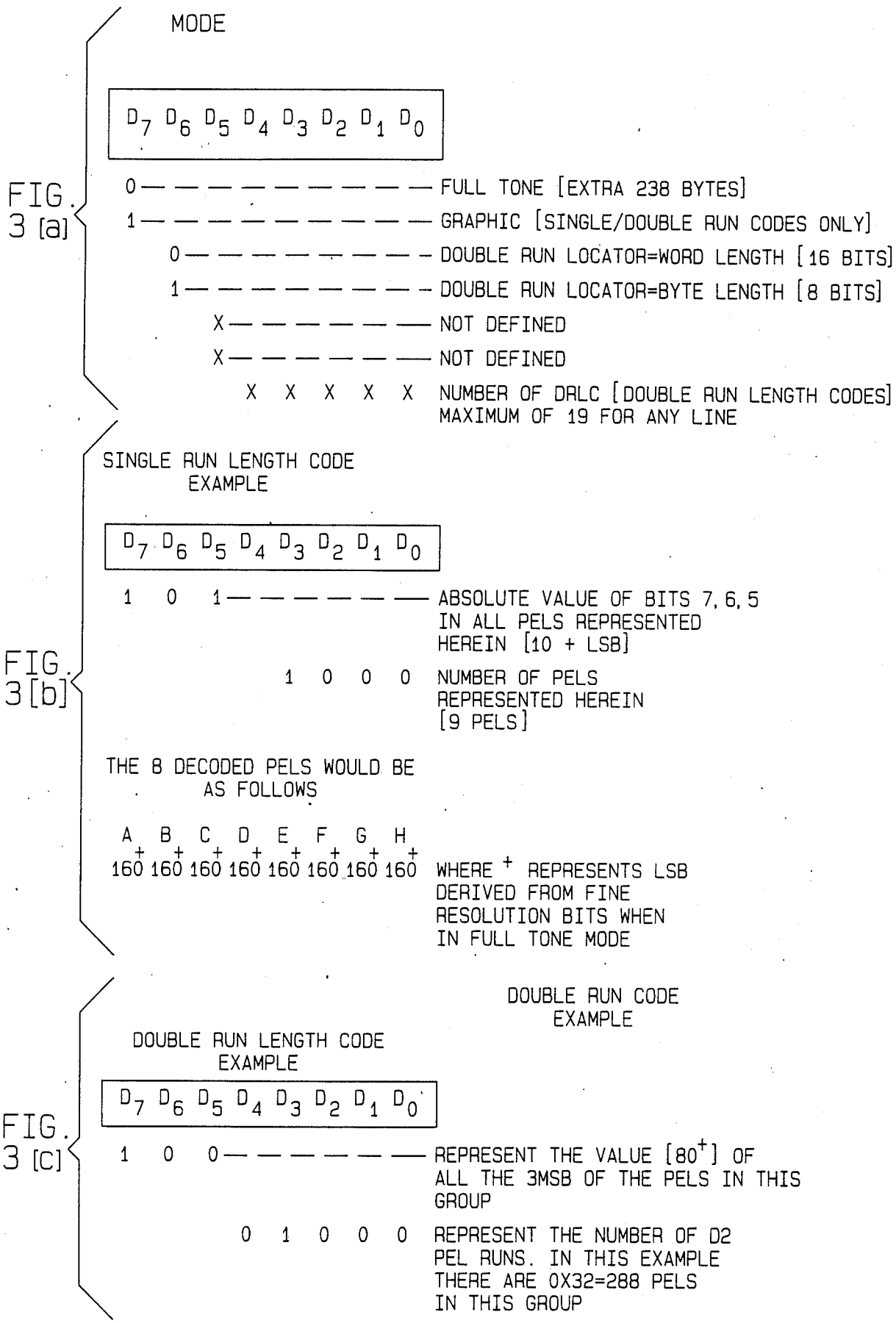

FINE RESOLUTION BYTE EXAMPLE
EXAMPLE VALUE
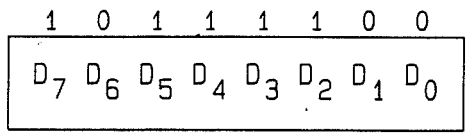
$D_4$ — — — — — — — REPRESENTS THE
$A$  4 BIT OF PEL A
$1$  A
　　　　[a]
$D_3$ — — — — — — REPRESENTS THE
$A$  3 BIT OF PEL A
$0$  A
　　　　[b]
$D_2$ — — — — — REPRESENTS THE
$A$  2 BIT OF PEL A
$1$  A
　　　　[c]
$D_4$ — — — — REPRESENTS THE
$C$  4 BIT OF PEL C
$1$  A
　　　　[d]
$D_4$ — — — REPRESENTS THE
$E$  4 BIT OF PEL E
$1$  A
　　　　[e]
$D_3$ — — — REPRESENTS THE
$E$  3 BIT OF PEL E
$1$  A
　　　　[f]
$D_2$ — — — REPRESENTS THE
$E$  2 BIT OF PEL E
$0$  A
　　　　[g]
$D_4$ — REPRESENTS THE
$G$  4 BIT OF PEL G
$0$  A
　　　　[h]
FIG.3[d]

RECONSTRUCTION OF ENCODED LINE

STEP E

| P_FL / D7 | A | B | C | D | E | F | G | H |
|---|---|---|---|---|---|---|---|---|
| 7 | 1 | 1 | 1 | 1 | 1 | 1 | 1 | 1 |
| 6 | 0 | 0 | 0 | 0 | 0 | 0 | 0 | 0 |
| 5 | 1 | 1 | 1 | 1 | 1 | 1 | 1 | 1 |
| 4 | 1 | 0 | 0 | 0 | 1 | 1 | 0 | 0 |
| 3 | 0 |   |   |   | 1 |   |   |   |
| 2 | 1 |   |   |   | 0 |   |   |   |
| 1 | 0 |   |   |   | 0 |   |   |   |
| 0 | 0 |   |   |   | 0 |   |   |   |
| PEL VALUE [HEX] | B4 |   |   |   | B8 |   |   |   |

THESE ARE THE PEL VALUES AFTER EXTRACTING THE DATA PRESENTED IN THE EXAMPLES FROM FIG.3[b] AND FIG.3[d]. NOTE THAT PEL A AND E ARE FULLY DEFINED FROM THE RECEIVED DATA [THE TWO LEAST SIGNIFICANT BITS KNOWN TO BE ZERO]

STEP F

| | A | B | C | D | E | F | G | H |
|---|---|---|---|---|---|---|---|---|
| 7 | 1 | 1 | 1 | 1 | 1 | 1 | 1 | 1 |
| 6 | 0 | 0 | 0 | 0 | 0 | 0 | 0 | 0 |
| 5 | 1 | 1 | 1 | 1 | 1 | 1 | 1 | 1 |
| 4 | 1 | 0 | 0 | 0 | 1 | 1 | 0 | 0 |
| 3 | 0 |   | 1 |   | 1 |   |   |   |
| 2 | 1 |   | 1 |   | 0 |   |   |   |
| 1 | 0 |   | 0 |   | 0 |   |   |   |
| 0 | 0 |   | 0 |   | 0 |   |   |   |
| | B4 |   | B6 |   | B8 |   |   |   |

THE VALUE OF PEL C IS OBTAINED BY AVERAGING THE VALUE OF PELS A AND E. NOTE THAT PEL Cs VALUE HAD TO BE WITHIN THE LIMITS:
B0 ≤ PELC ≤ BC

STEP G

| | A | B | C | D | E | F | G | H |
|---|---|---|---|---|---|---|---|---|
| 7 | 1 | 1 | 1 | 1 | 1 | 1 | 1 | 1 |
| 6 | 0 | 0 | 0 | 0 | 0 | 0 | 0 | 0 |
| 5 | 1 | 1 | 1 | 1 | 1 | 1 | 1 | 1 |
| 4 | 1 | 0 | 0 | 0 | 1 | 1 | 0 | 0 |
| 3 | 0 | 0 | 1 |   | 1 |   |   |   |
| 2 | 1 | 1 | 1 |   | 0 |   |   |   |
| 1 | 0 | 0 | 0 |   | 0 |   |   |   |
| 0 | 0 | 0 | 0 |   | 0 |   |   |   |
| | B4 | B5 | B6 |   | B8 |   |   |   |

THE VALUE OF PEL B IS OBTAINED BY AVERAGING THE VALUE OF PELS A AND C. NOTE THAT PEL Bs VALUE HAD TO BE WITHIN THE LIMITS:
A0 ≤ PEL B ≤ BC

STEP H

| | A | B | C | D | E | F | G | H |
|---|---|---|---|---|---|---|---|---|
| 7 | 1 | 1 | 1 | 1 | 1 | 1 | 1 | 1 |
| 6 | 0 | 0 | 0 | 0 | 0 | 0 | 0 | 0 |
| 5 | 1 | 1 | 1 | 1 | 1 | 1 | 1 | 1 |
| 4 | 1 | 0 | 0 | 0 | 1 | 1 | 0 | 0 |
| 3 | 0 | 0 | 1 | 1 | 1 | 1 | 0 | 1 |
| 2 | 1 | 1 | 1 | 1 | 0 | 1 | 1 | 0 |
| 1 | 0 | 0 | 0 | 1 | 0 | 0 | 1 | 0 |
| 0 | 0 | 0 | 0 | 0 | 0 | 0 | 0 | 0 |
| | B4 | B5 | B6 | B7 | B8 |   |   |   |

THE VALUE OF PEL D IS OBTAINED BY AVERAGING THE VALUE OF PELS C AND E. NOTE THAT PEL Ds VALUE HAD TO BE WITHIN THE LIMITS:
A0 ≤ PEL D ≤ BC

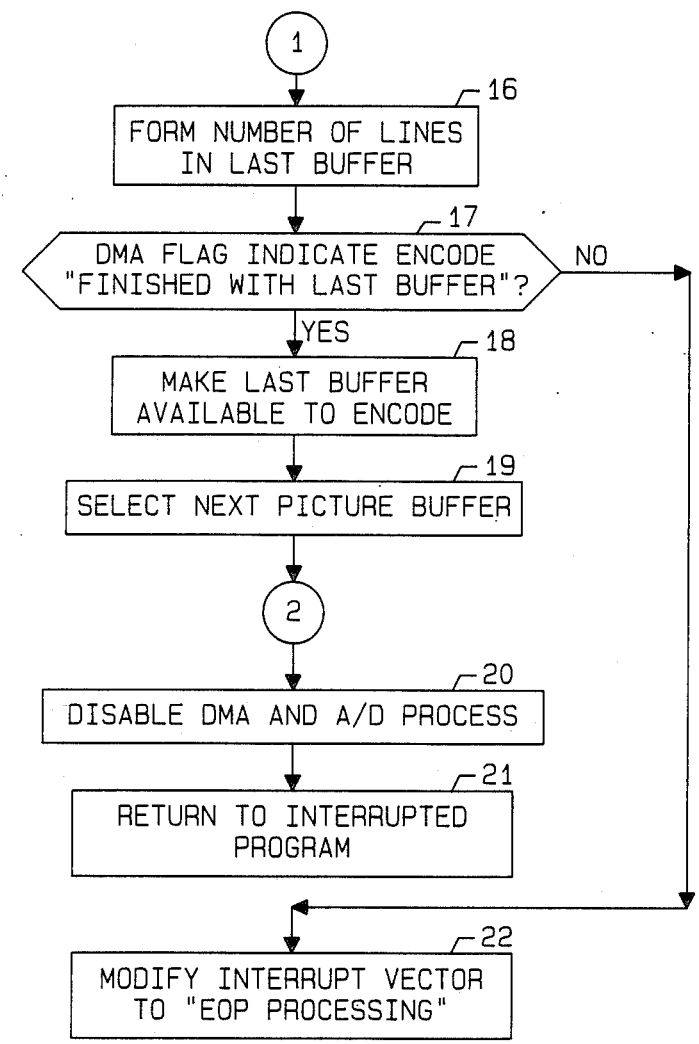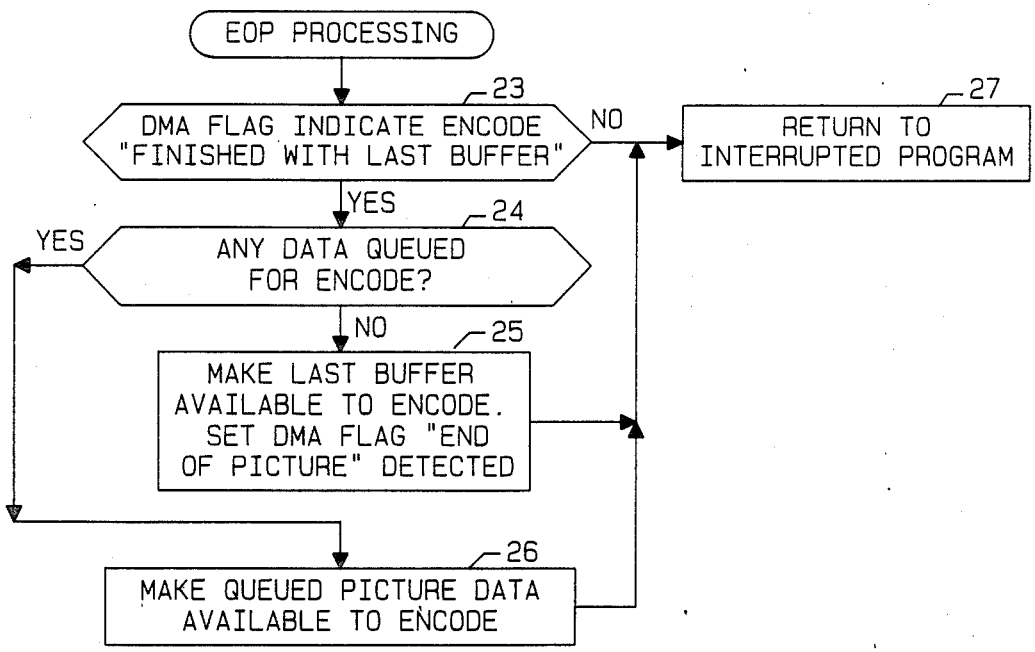
FIG. 7
SHEET 2 OF 2

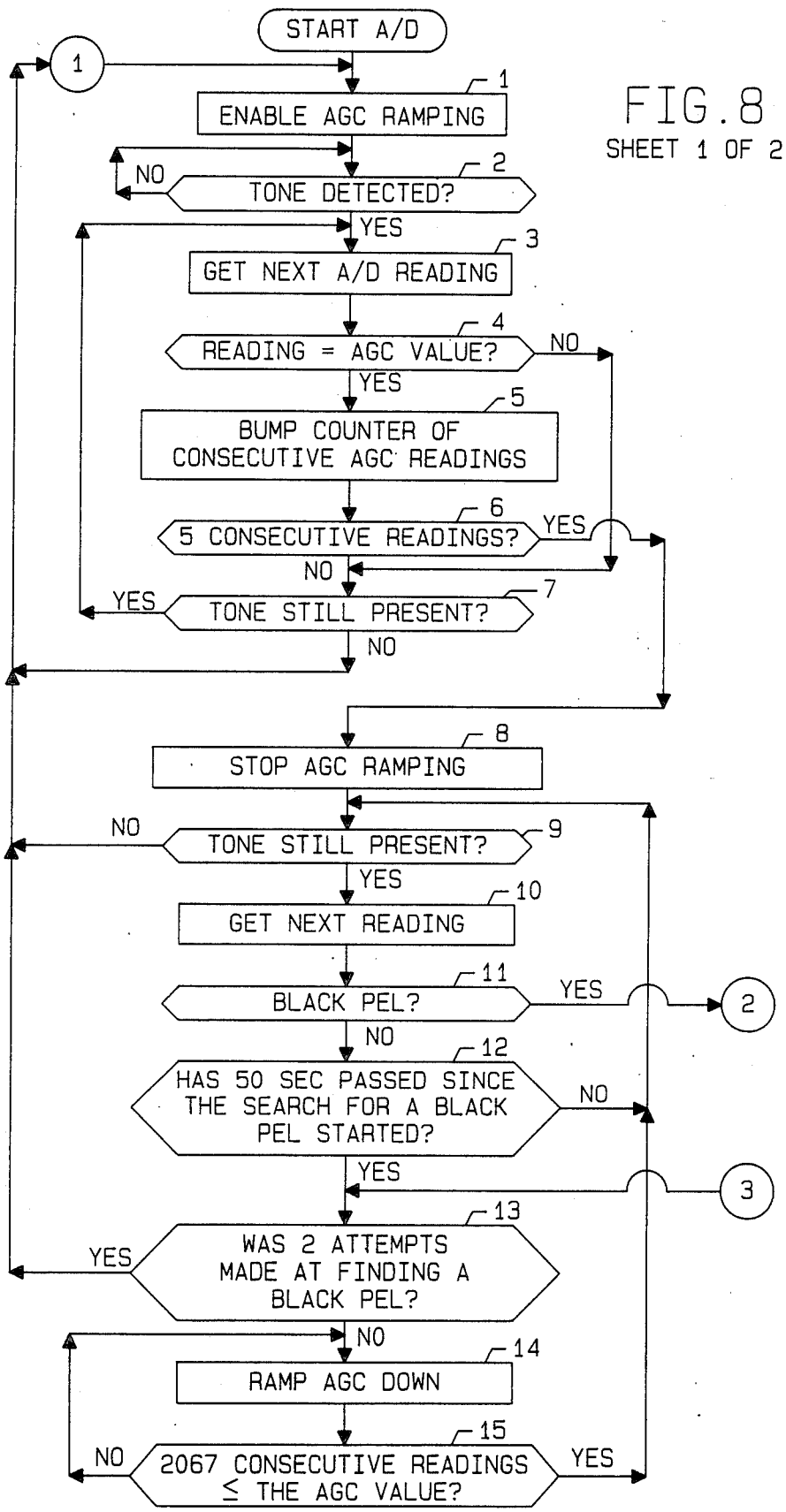

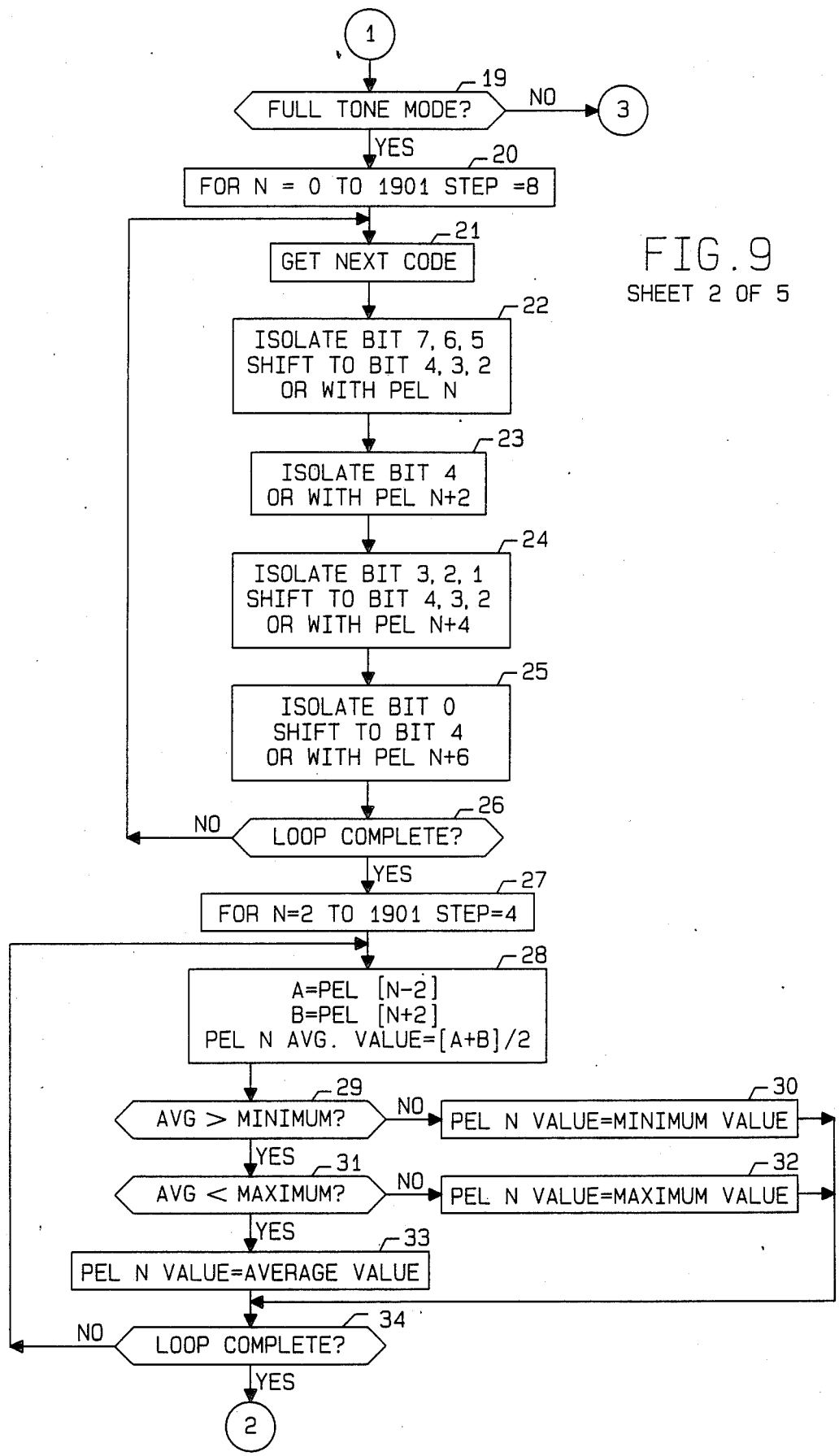

Full Tone Lookup

Graphics Lookup

METHOD FOR COMPRESSION AND TRANSMISSION OF VIDEO INFORMATION

BACKGROUND OF THE INVENTION

This invention relates to a method for compression and transmission of video information, and is particularly useful in, but not limited to, facsimile transmission systems employing digital data transmission.

The transmission of digital video information such as images of pictures, graphs, and text material usually employs a form of pulse code modulation (PCM) and requires the transmission of a large number of picture elements ("pixels" or "pels").

In digital facsimile transmission, an original image such as a picture or other document is scanned by a photosensor in a series of vertically spaced parallel horizontal lines, i.e. in a manner generally similar to (but usually much slower than) the scanning of a television image. The output of the photosensor is sampled in synchronism with the scanning of the original. Each sample, corresponding to the darkness of one "dot" or pixel of video information, is then converted from analog form to a digital byte consisting of a number of bits, the value of which byte corresponds to the amplitude of the video signal generated by the photosensor.

The transmission path, whether a telephone line or a wireless channel, is usually of limited bandwidth, so that in many cases the transmission time is longer than is desirable.

To reduce the transmission time of such video information, signal compression techniques are commonly employed. These techniques reduce the amount of data which must be transmitted by reducing redundancy in the video information and/or sacrificing gray scale range or resolution.

The present invention deals with transmission of digital video information, and applies to all systems in which the video information is digital in nature, even though it may be transmitted as a digitally modulated analog signal or in some other form.

Such facsimile and other video information transmission systems are well known in the art. See, e.g., U.S. Pat. No. 4,547,810 entitled Portable Facsimile Transmitter (the disclosure of which patent is incorporated herein by reference). Also see U.S. Pat. No. 3,678,388; International Application No. PCT/US79/00729 filed in the United States as Priority Application No. 943,523 on Sept. 18, 1978; U.S. Pat. No. 4,153,916; U.S. Pat. No. 3,902,008; U.S. Pat. No. 3,688,039; U.S. Pat. No. 3,673,322; and French Pat. Nos. 72.05254 (Pub. No. 2,125,532), 77.38332 (Pub. No. 2,374,796), and 78.19012 (Pub. No. 2,396,478).

French Pat. No. 72.05254 relates to an analog signal compression technique.

In U.S. Pat. No. 3,688,039 a synchronizing code, which denotes the beginning of each scanned line, is followed by an error detecting code. When an error is detected in the error detecting code at the receiving end, the corresponding video line is replaced with video information from the first preceding line in which an error was not detected.

U.S. Pat. No. 3,902,008 discloses one form of a type of digital data compression known as run length coding, where instead of transmitting sequences of identical bytes, the first byte of each sequence is transmitted together with a code designating the number of identical bytes in the sequence which follows.

It is also known to use run length coding for groups of run length encoded sequences (also known as double run length coding), so that where a group of run length encoded bytes is repeated a number of times, only the first group is transmitted, along with a run length code designating the number of repetitions of that group.

An object of the present invention is to provide an improved method for the compression and transmission of video information.

SUMMARY OF THE INVENTION

The present invention provides methods for encoding and decoding digital video information wherein a series of data bits define the values of corresponding pixels of said image.

The encoding method encodes digital video information derived from the scanning of an image to provide a digital code wherein a series of data bits define the values of corresponding pixels of said image. This method is carried out by providing a first predetermined number of most significant data bits and a second predetermined number of less significant data bits defining the value of each pixel. The most significant data bits of each pixel are run length encoded, and combined in a bit train with a series of fine resolution bytes, each of said fine resolution bytes containing one or more less significant data bits of selected ones of a group of adjacent pixels.

The decoding method decodes said bit train by decoding said run length encoded data bits to reconstruct the most significant data bits of each pixel. Each of said fine resolution bytes is decoded to provide one or more less significant data bits of each of said selected pixels. The encoded data bits of said selected pixels are reconstructed by combining the reconstructed most significant bits of each selected pixel with corresponding decoded less significant bits thereof, at least some of said selected pixels having a greater number of reconstructed data bits than other pixels interleaved therewith. The values of any remaining less significant bits of particular ones of said selected pixels are determined by, for each such particular pixel, averaging the values of other selected pixels preceding and succeeding said particular pixel by the same number of intermediate pixels. The values of the less significant bits of all other pixels are determined by, for each such other pixel, averaging the values of selected pixels preceding and succeeding said other pixel by the same number of intermediate pixels.

More specifically, according to one aspect of the invention there is provided a method for encoding digital video information derived from the scanning of an image to provide a digital code wherein a series of data bits define the values of corresponding pixels of said image. The method comprises the steps of: (a) providing a first predetermined number of data bits defining the value of each pixel; (b) encoding a second predetermined number, less than said first predetermined number, of the most significant data bits of each pixel; and (c) combining in a bit train with said encoded most significant data bits a series of fine resolution bytes equal in number to a predetermined fraction of the number of pixels, one of said fine resolution bytes being provided for each group of a fourth predetermined number of adjacent pixels.

Each fine resolution byte is structured so that a fifth predetermined number of bits, equal to the difference between said first and second predetermined numbers, of each of said fine resolution bytes corresponds to all of the least significant bits of the value of a first pixel of said group, so that each first pixel has said first predetermined number of fully defined bits; and so that another fifth predetermined number of bits of each of said fine resolution bytes corresponds to all of the least significant bits of the value of a second pixel of said group, so that each second pixel has said first predetermined number of fully defined bits.

Said first and second pixels are spaced from each other by a predetermined number of pixels, one bit of each of said fine resolution bytes corresponding to the next most significant bit, after said second predetermined number of most significant bits, of a third pixel intermediate between and spaced by the same number of pixels from one of said first pixels and one of said second pixels, so that each third pixel has one more than said second predetermined number of fully defined bits. Another bit of each of said fine resolution bytes corresponds to the next most significant bit, after said second predetermined number of most significant bits, of a fourth pixel intermediate between and spaced by the same number of pixels from one of said first pixels and one of said second pixels, so that each fourth pixel has one more than said second predetermined number of fully defined bits.

According to another aspect of the invention, there is provided a method for decoding said digital video information, comprising the steps of: decoding said composite bit train to regenerate (i) first and second pixel values each having said first predetermined number of fully defined bits, (ii) third and fourth pixel values each having one more than said second predetermined number of fully defined bits, and (iii) other pixel values each having said second predetermined number of fully defined bits. Then a first average value of each pair of adjacent regenerated first and second pixels, having said first predetermined number of bits, is computed, and each said first average value is compared with the value of the third or fourth pixel intermediate between the corresponding first and second pixels and having one more than said second predetermined number of fully defined bits.

When the most significant bits of said first average value, numbering one more than said second predetermined number of most significant bits, are identical to the corresponding most significant bits of the value of said intermediate third or fourth pixel, the remaining least significant bits of said intermediate third or fourth pixel are set equal to the corresponding remaining least significant bits of said first average value respectively.

When the value of the most significant bits, numbering one more than said second predetermined number of most significant bits, of said first average value is less than that of the corresponding most significant bits of the value of said intermediate third or fourth pixel, the remaining least significant bits of said intermediate third or fourth pixel are set at the minimum possible value thereof.

When the value of the most significant bits, numbering one more than said second predetermined number of most significant bits, of said first average value is greater than that of the corresponding most significant bits of the value of said intermediate third or fourth pixel, the remaining least significant bits of said intermediate third or fourth pixel are set at the maximum possible value thereof.

This decoding method thus provides each of said third and fourth pixels with said first predetermined number of bit values, to entirely reconstruct the encoded digital video information.

IN THE DRAWING

FIG. 2(a) is a diagram showing the structure of an encoded line of video information as the same is transmitted by a transmitter to a remote receiver;

FIG. 2(b) is a diagram corresponding to that of FIG. 2(a), containing additional explanatory material;

Figure 1:
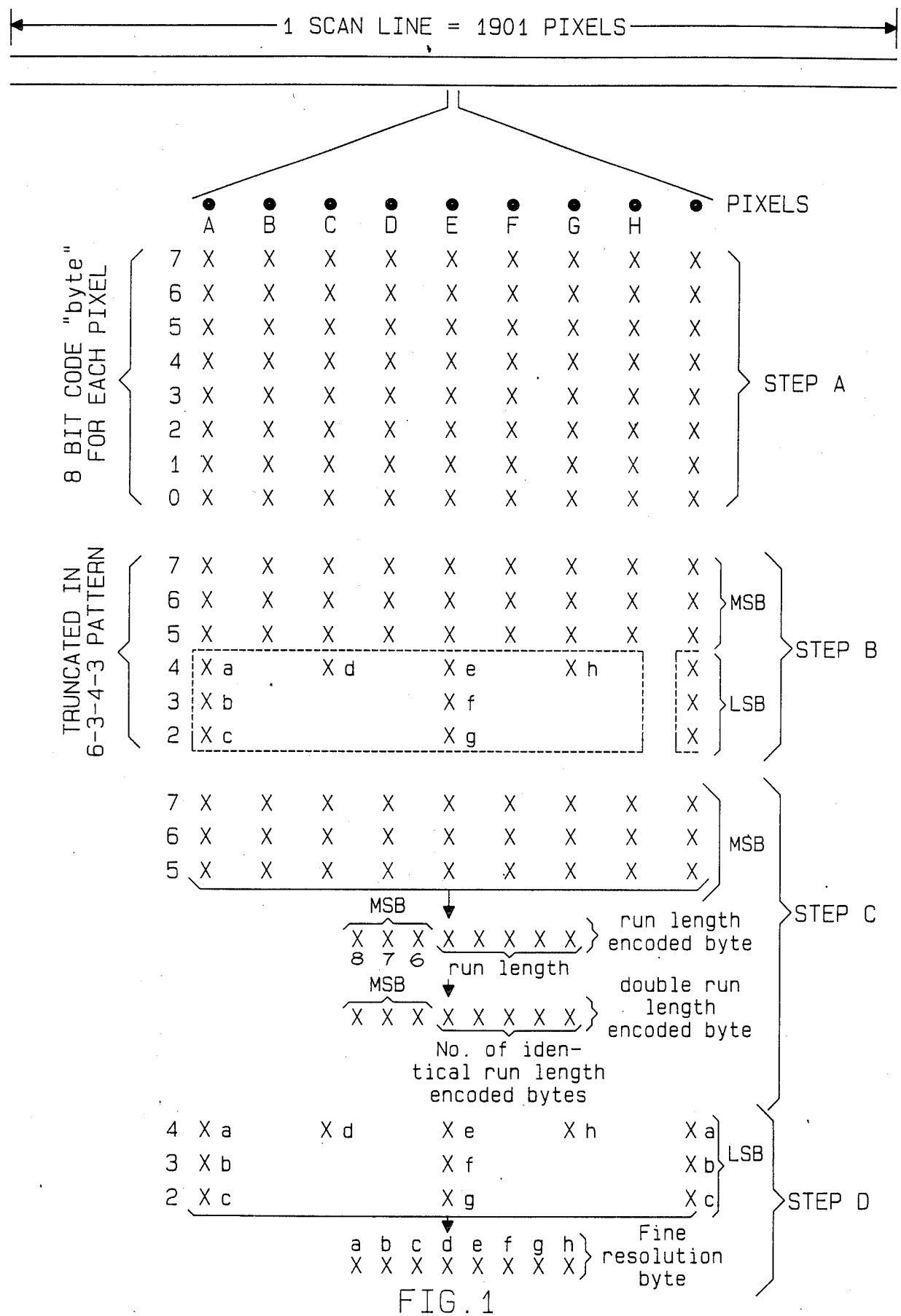
FIG. 1 is diagram showing the four principal steps involved in the encoding method according to a first aspect of the present invention.
Figure 5:
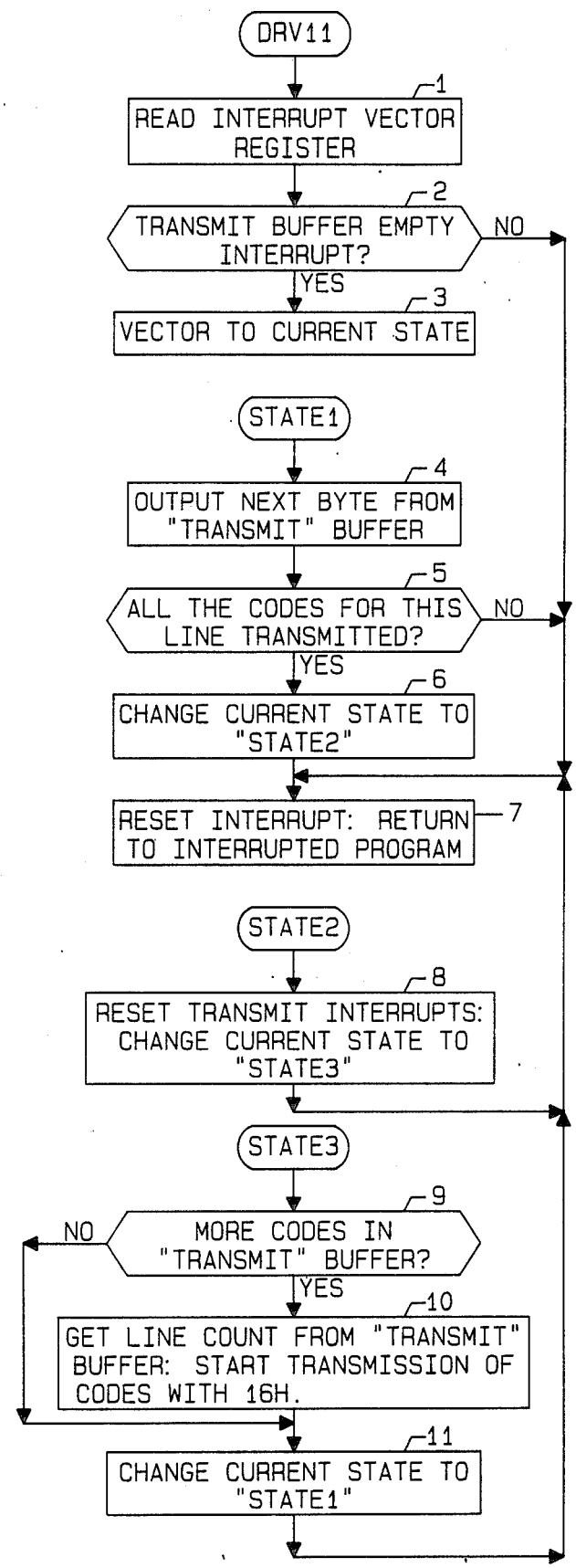
Figure 5:
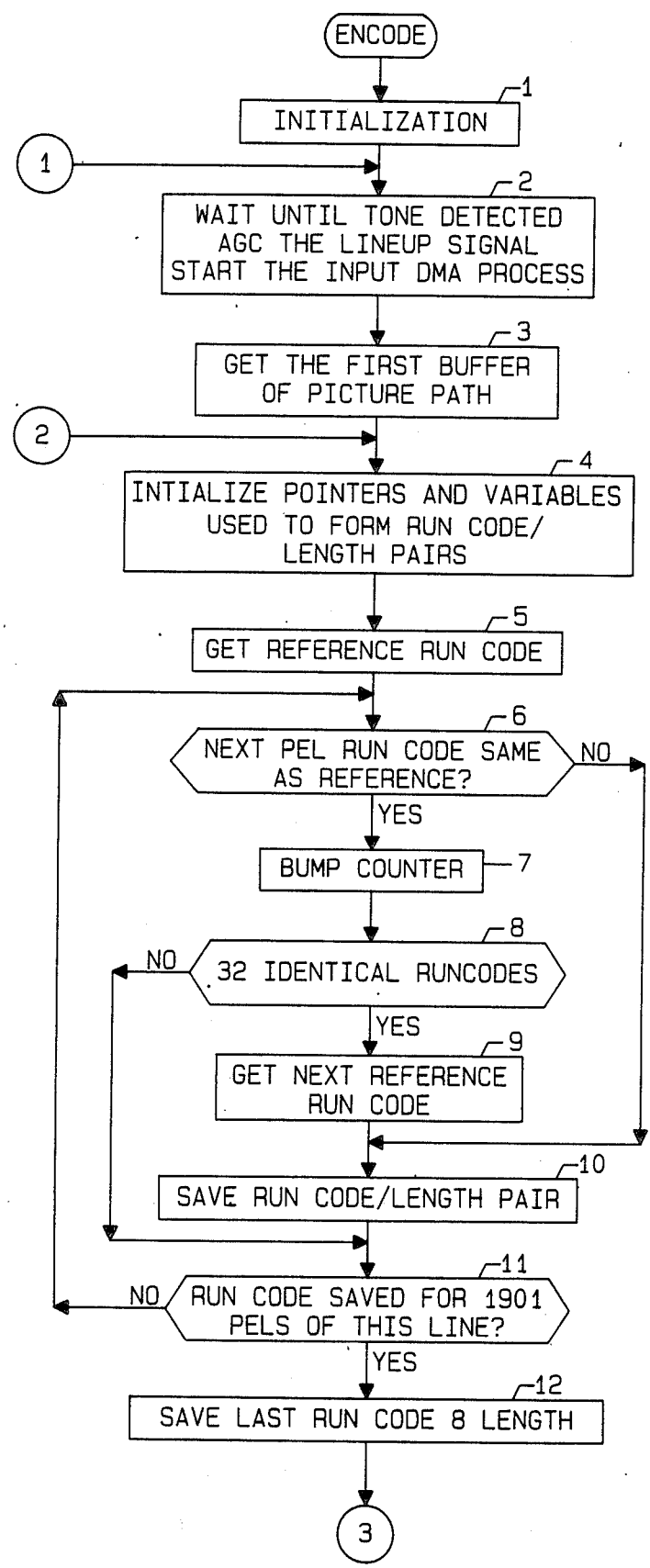
Figure 6:
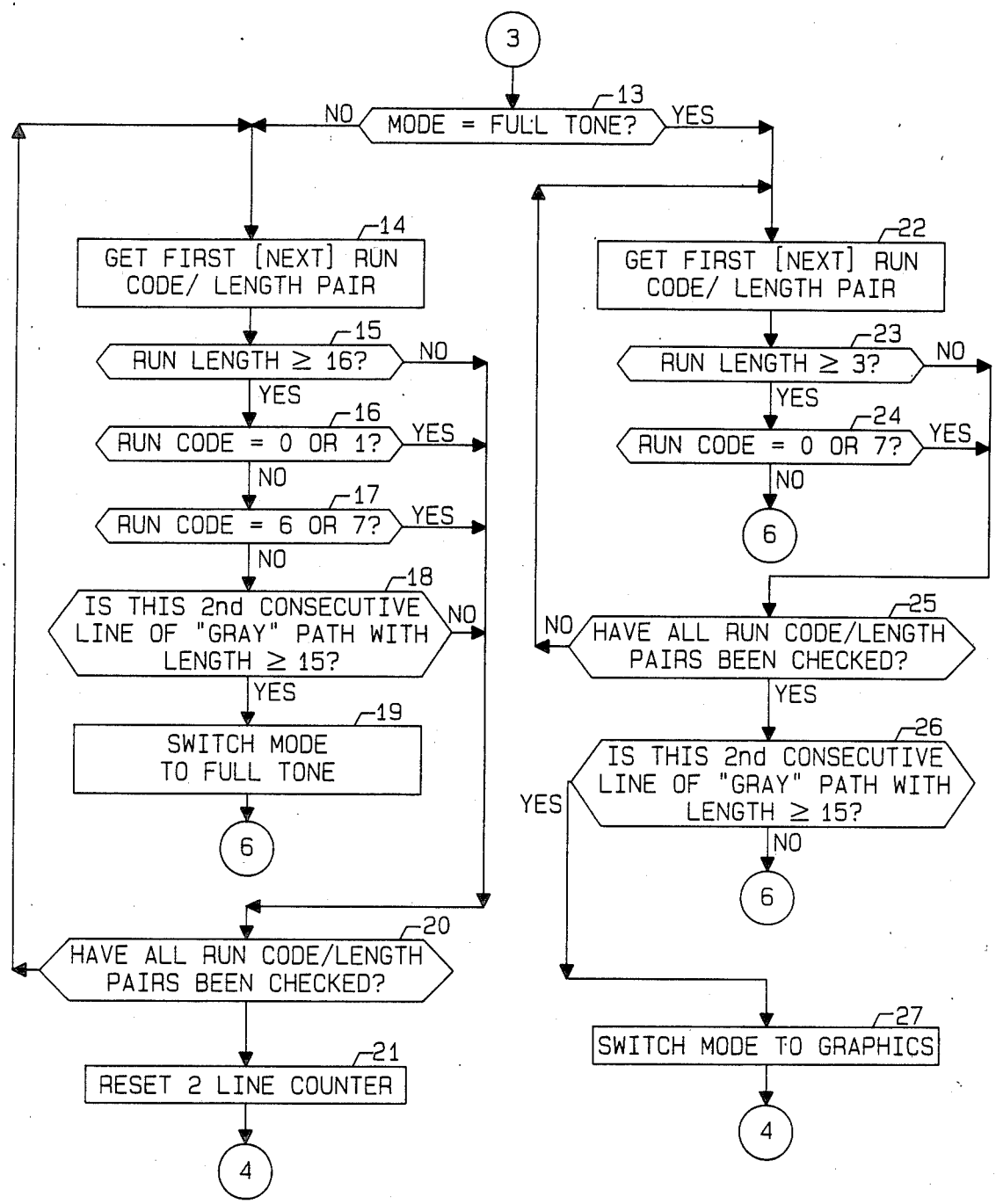
Figure 6:
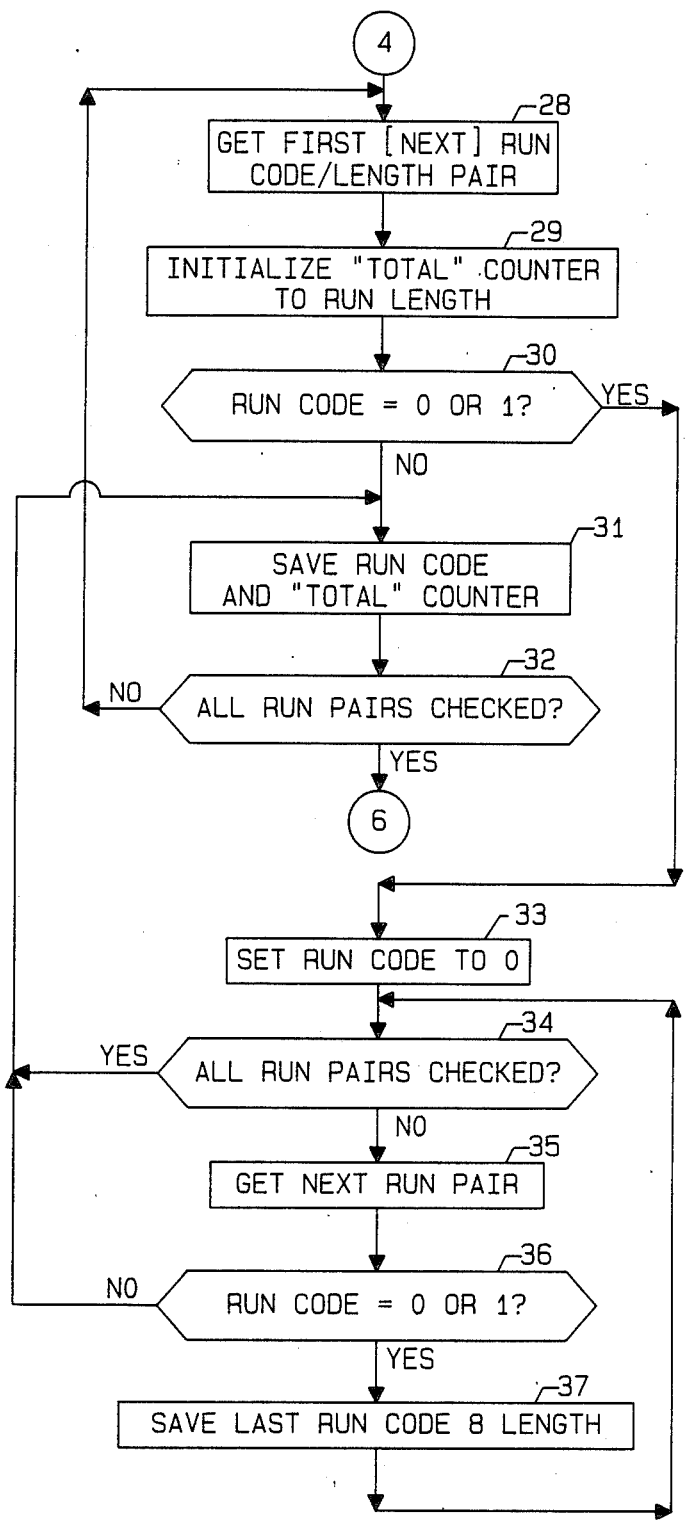
Figure 6:
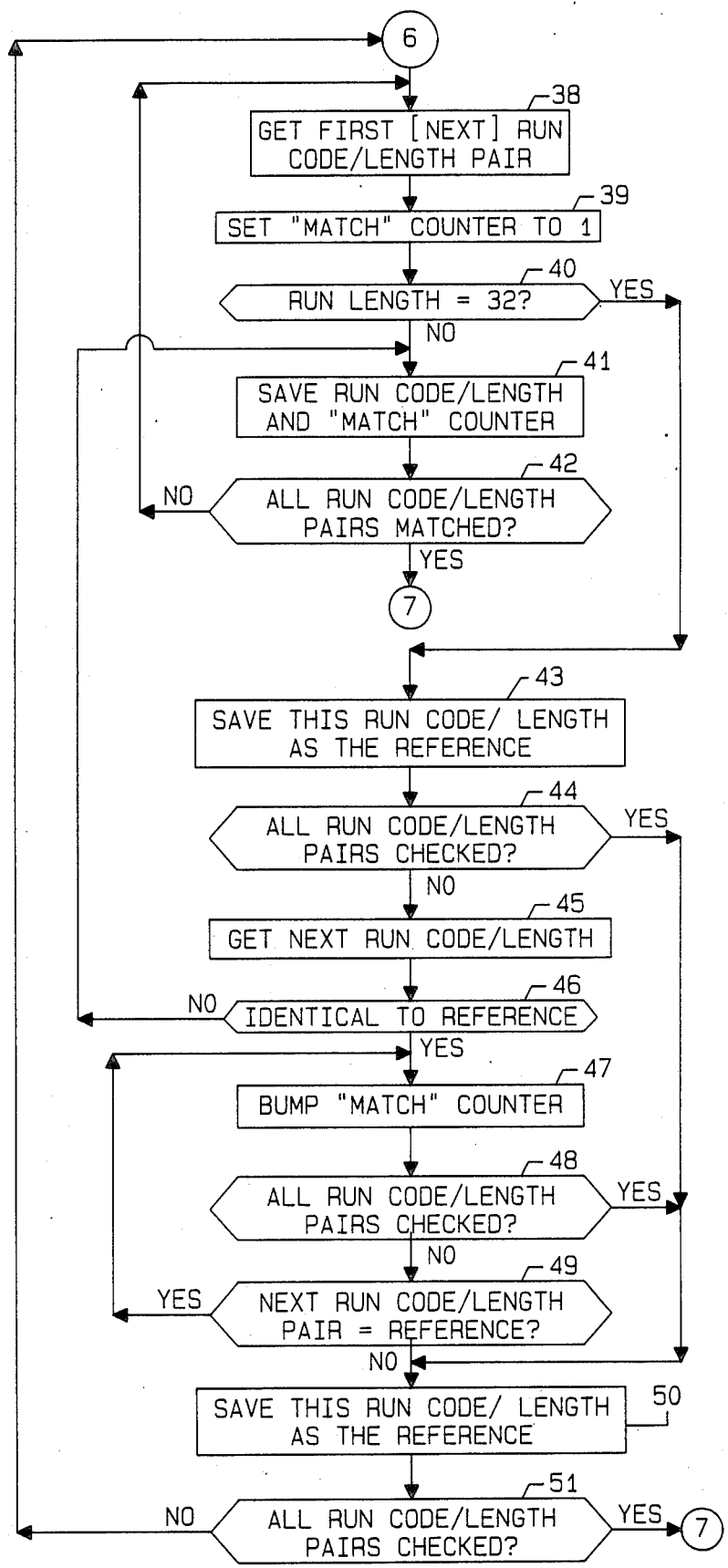
Figure 6:
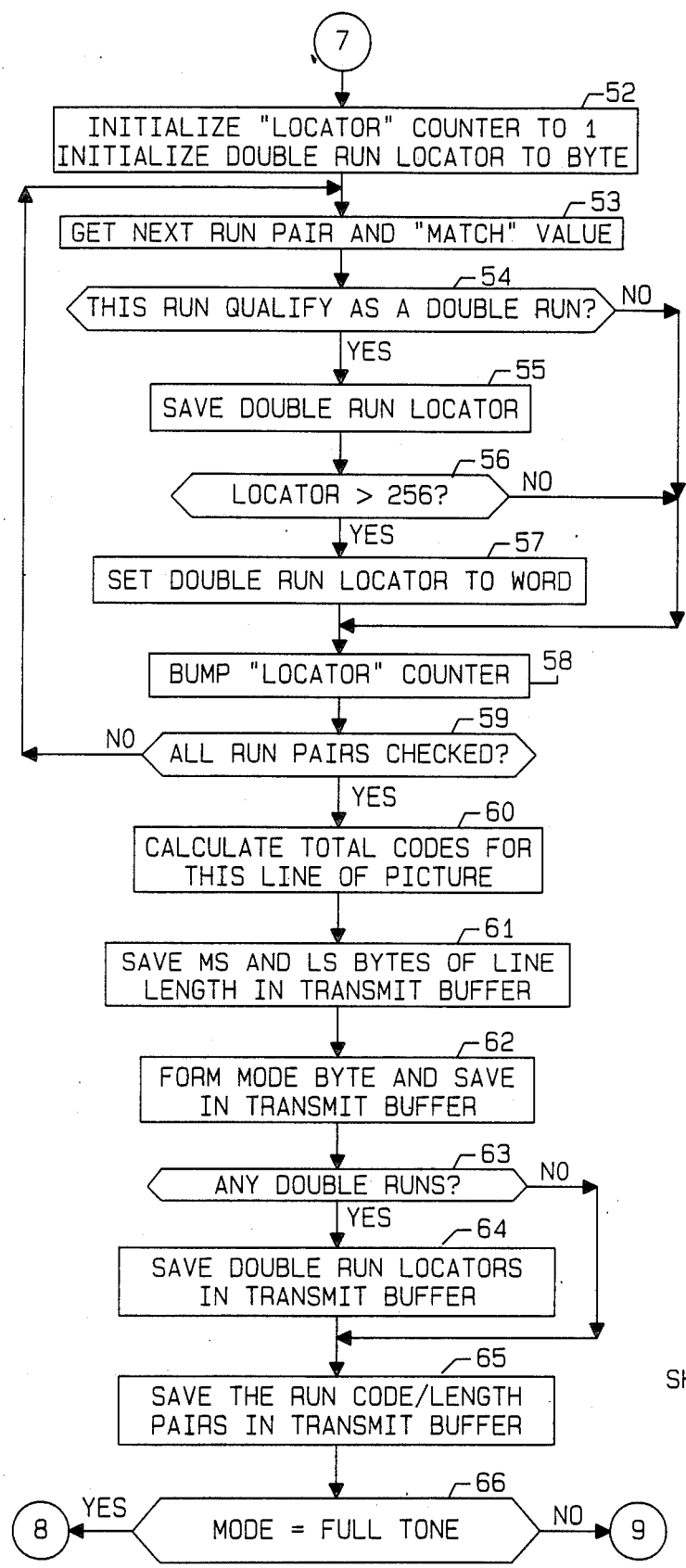
Figure 6:
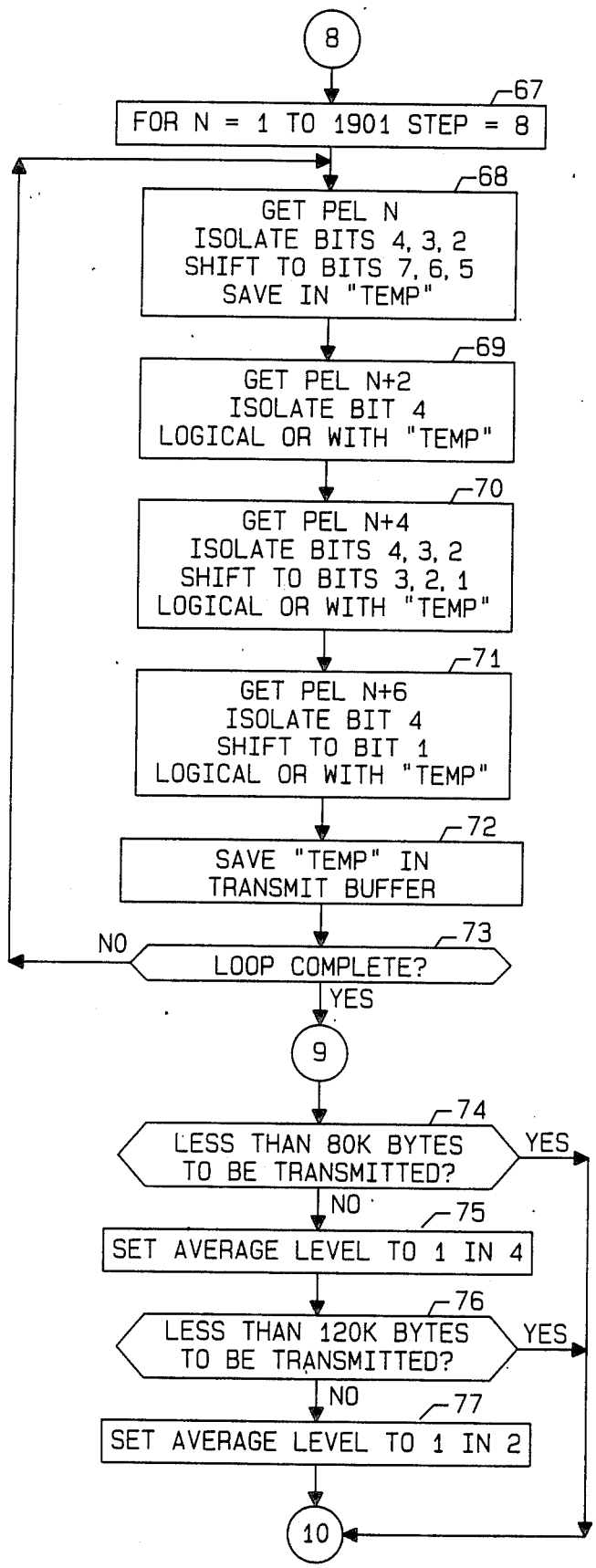
Figure 6:
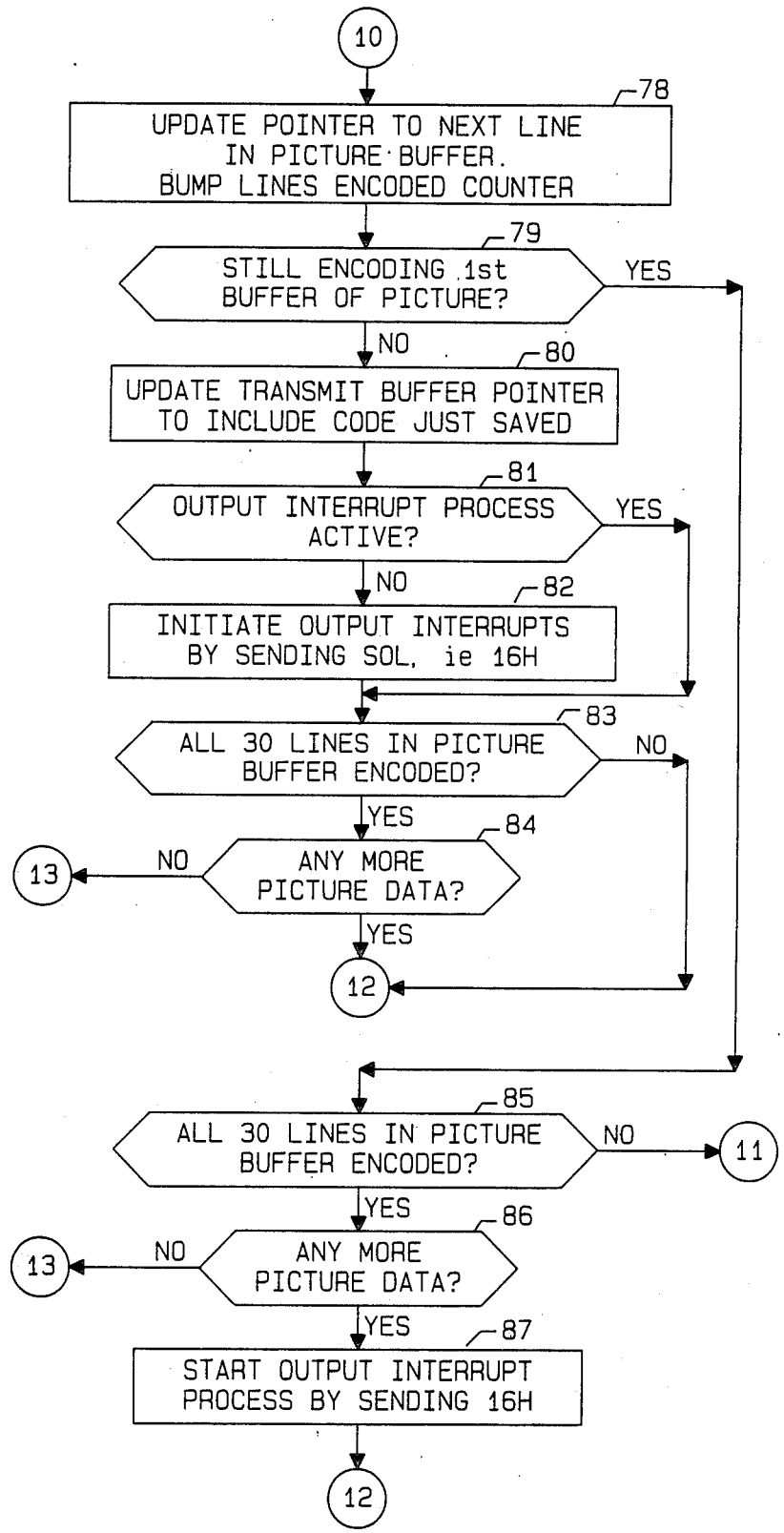
Figure 6:
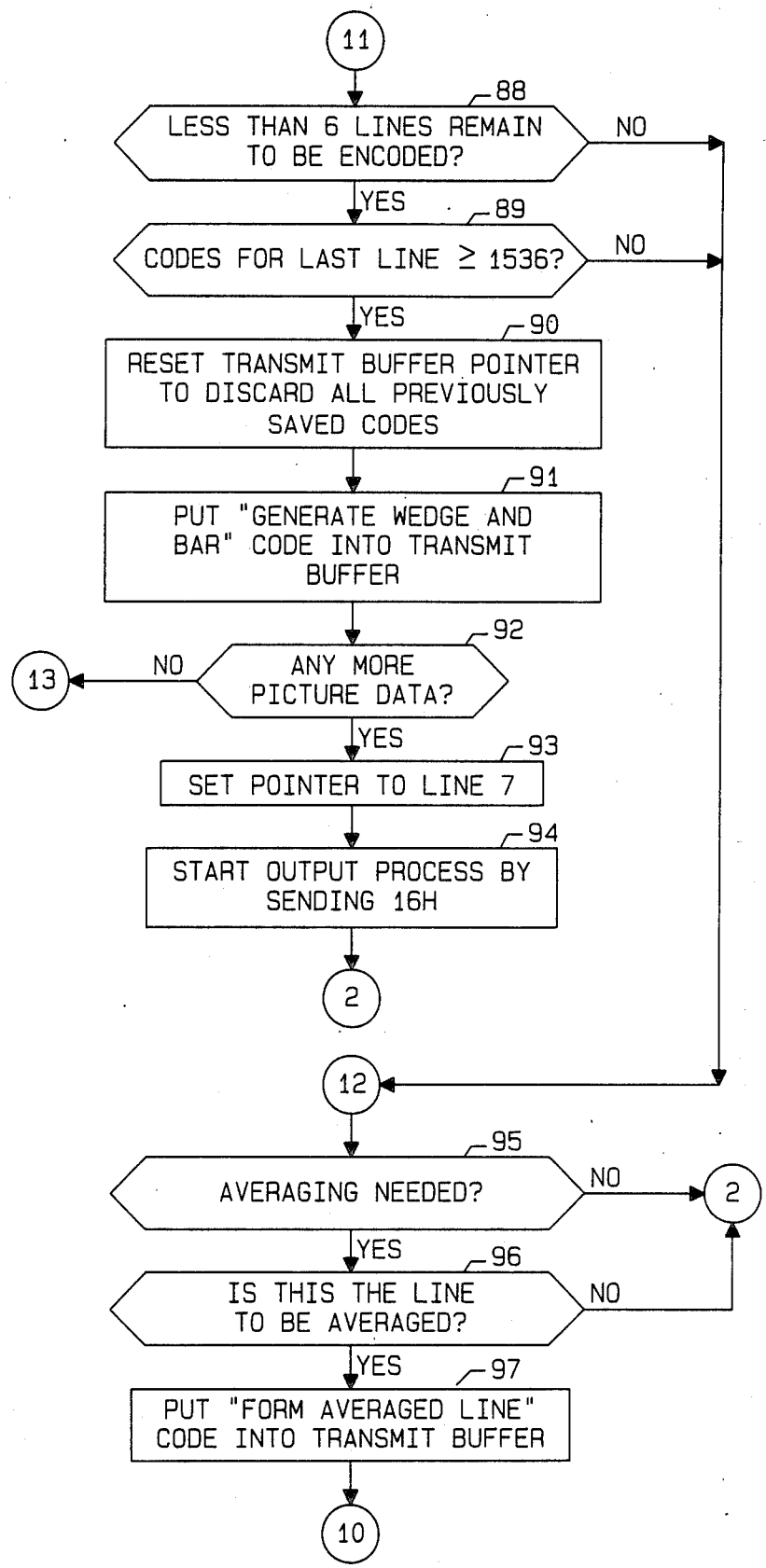
Figure 6:
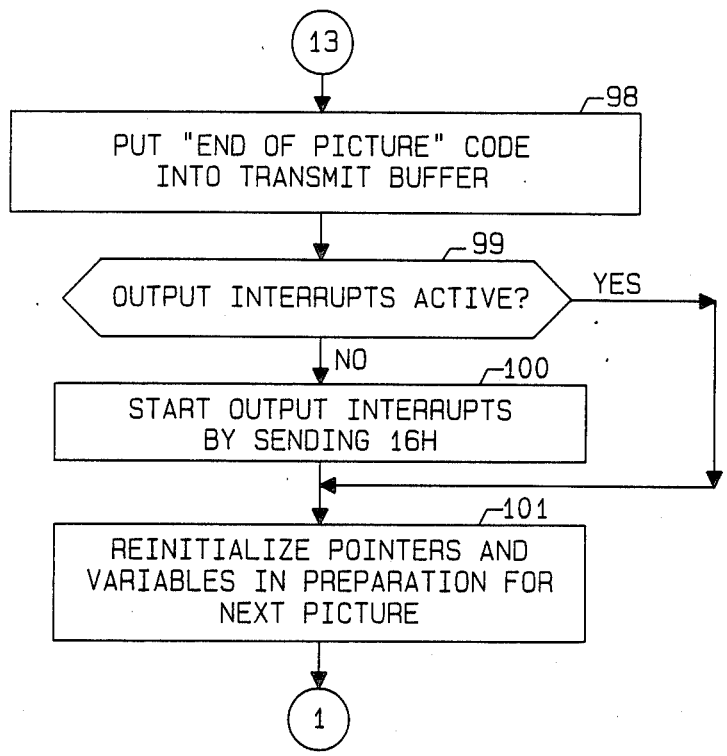
Figure 7:
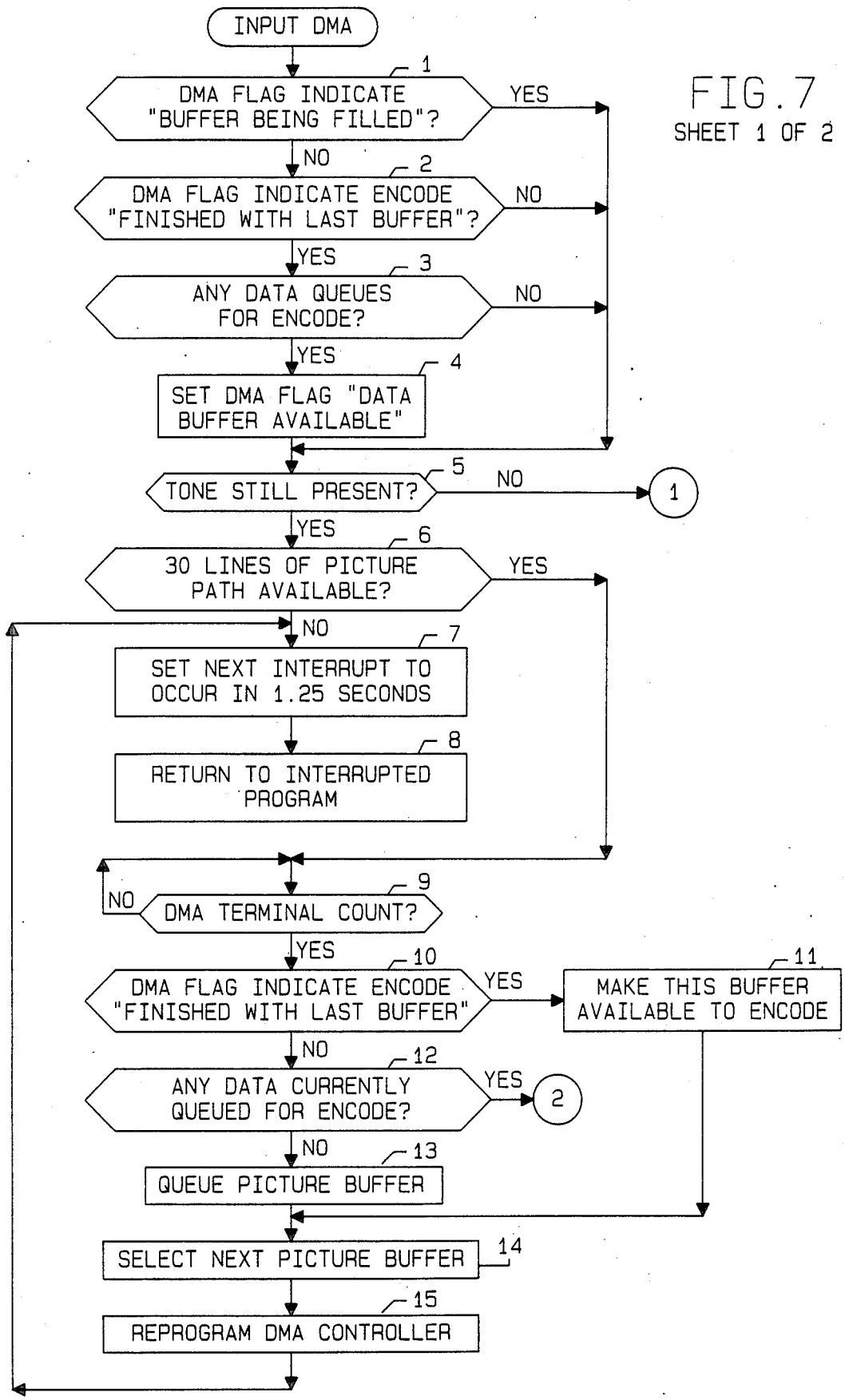
Figure 8:
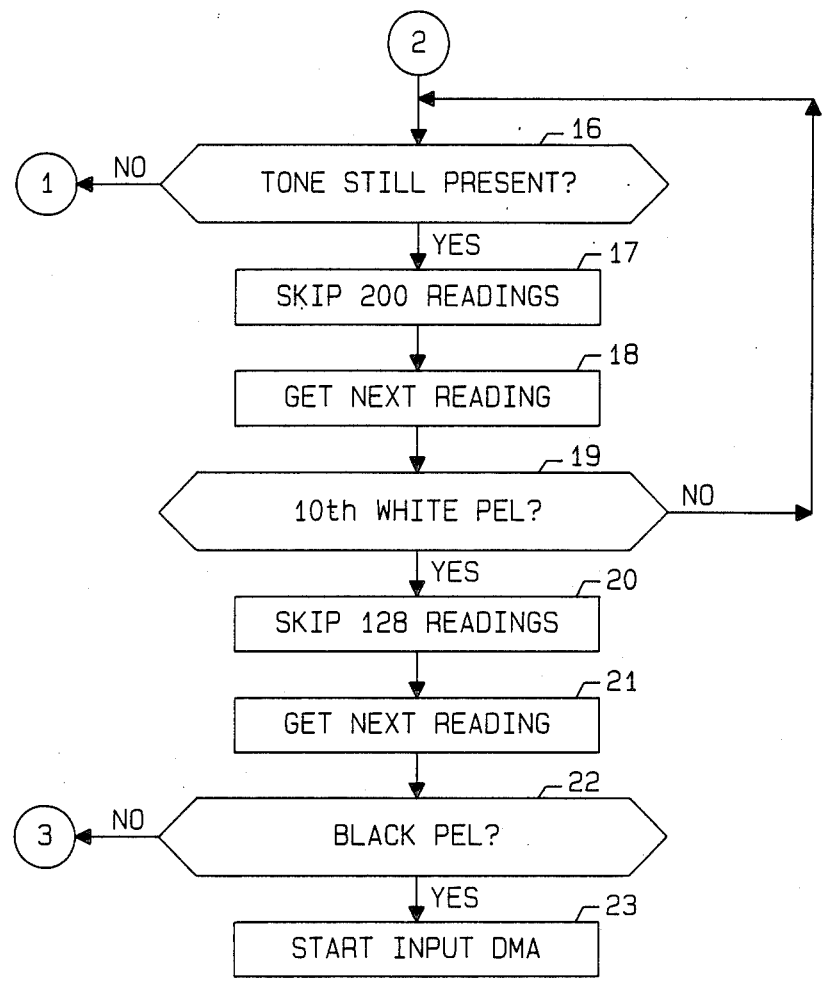
Figure 9:
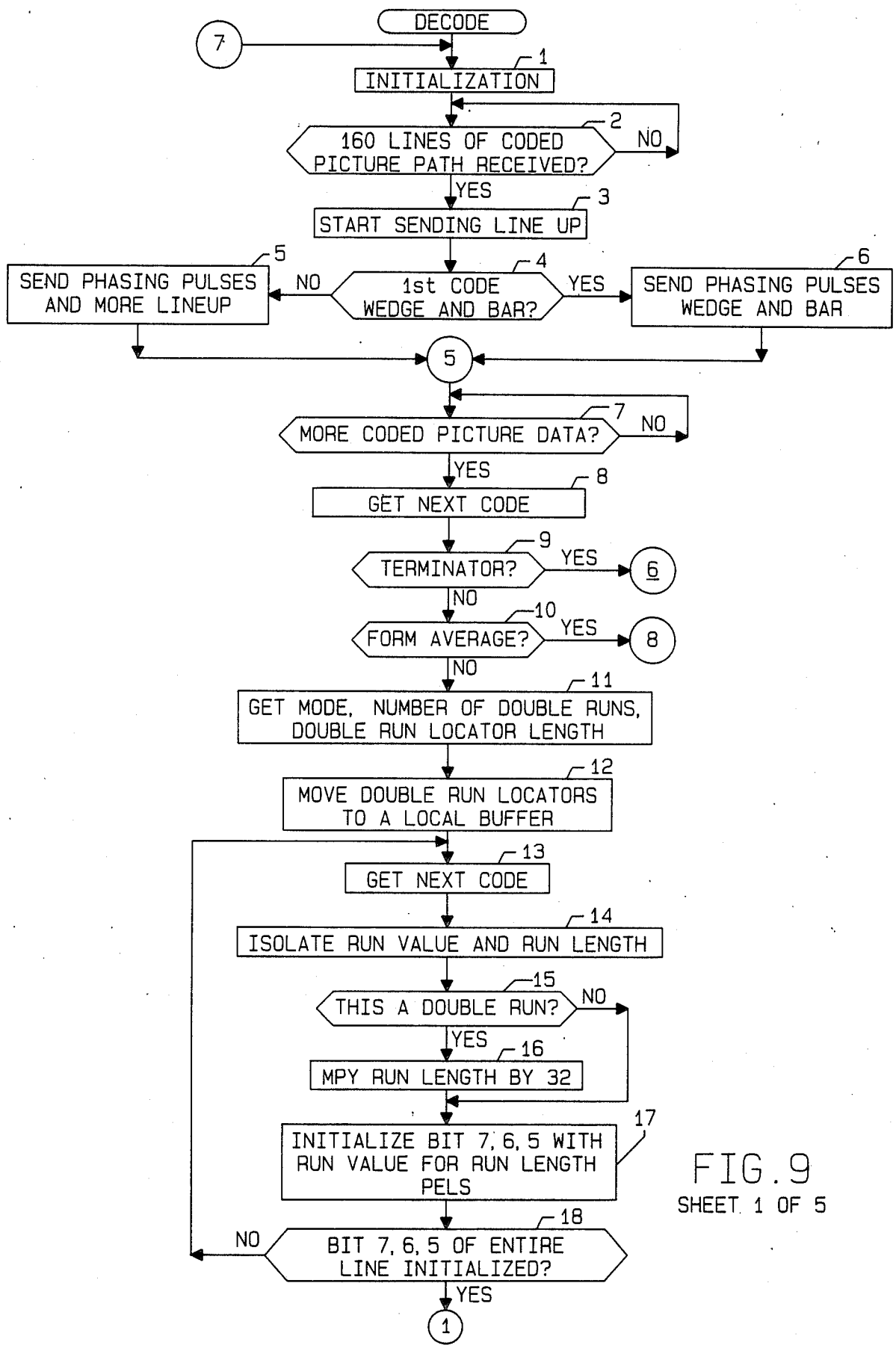
Figure 9:
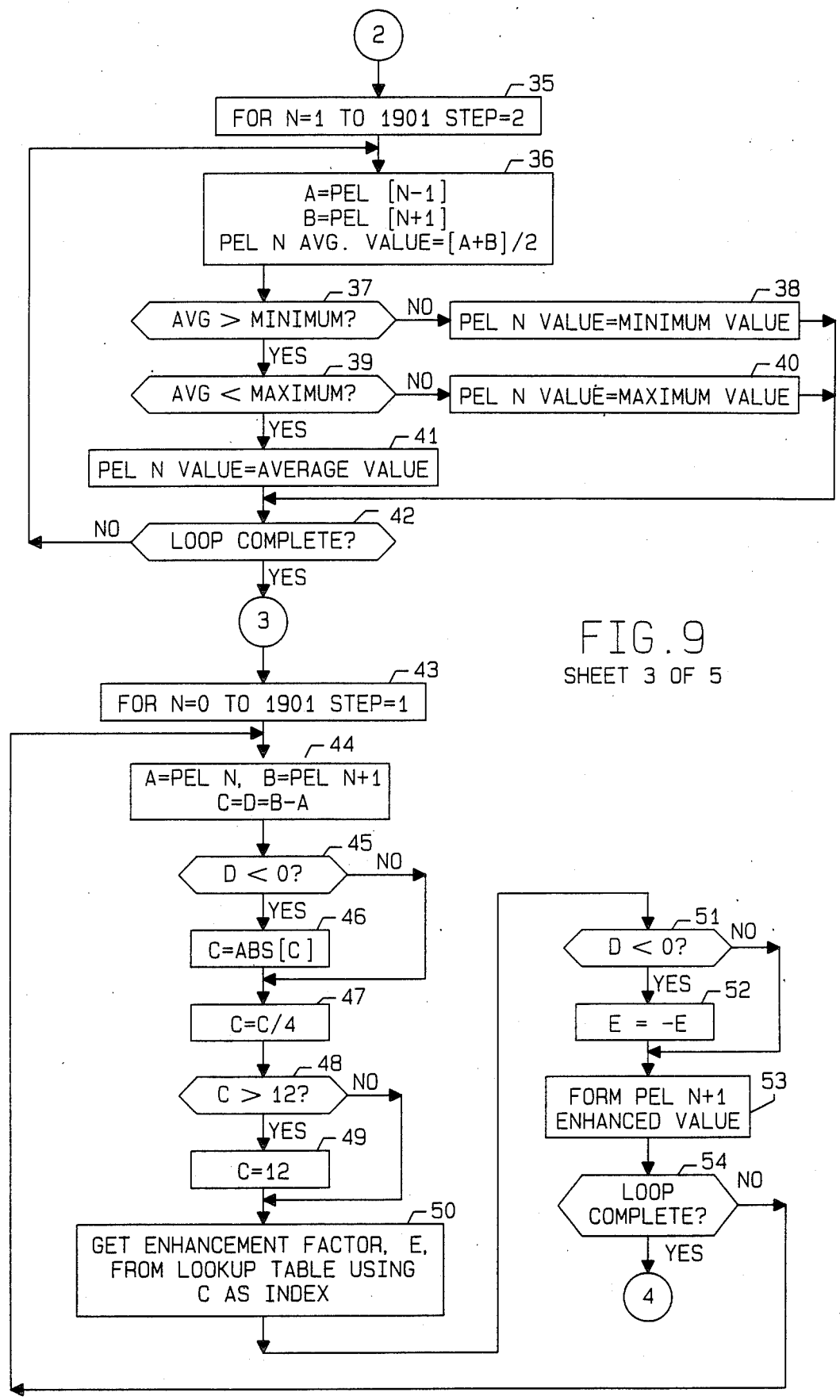
Figure 9:
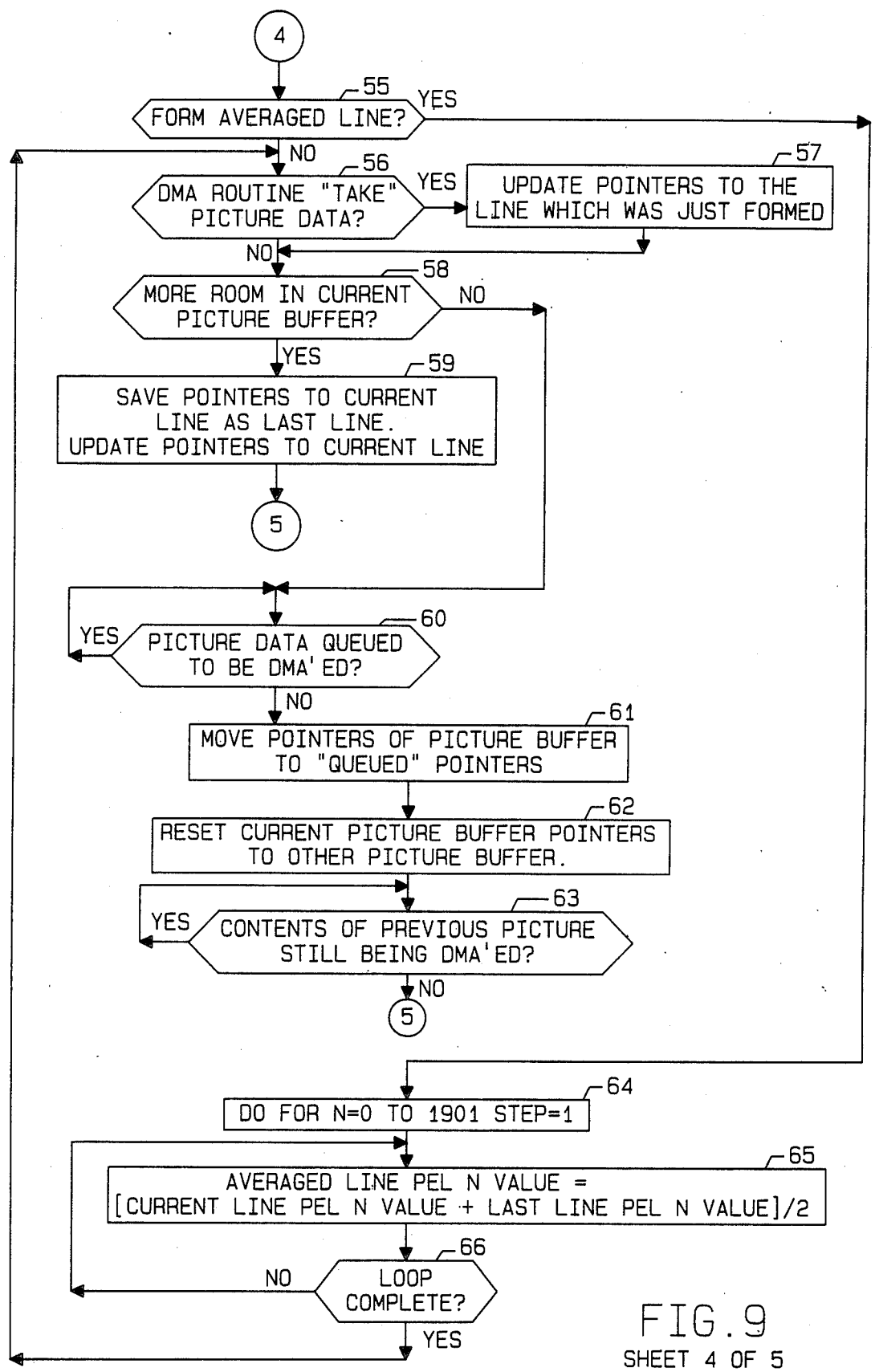
Figure 9:
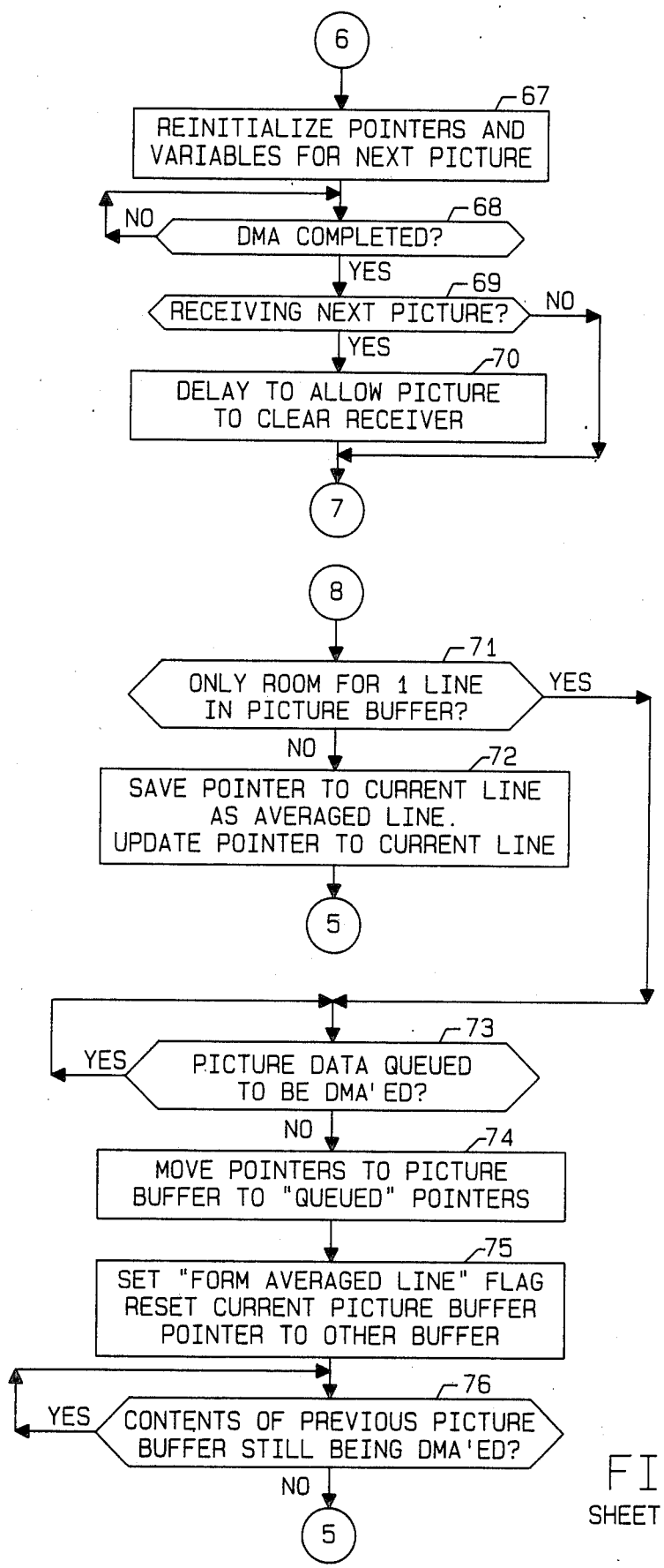
Figure 10:
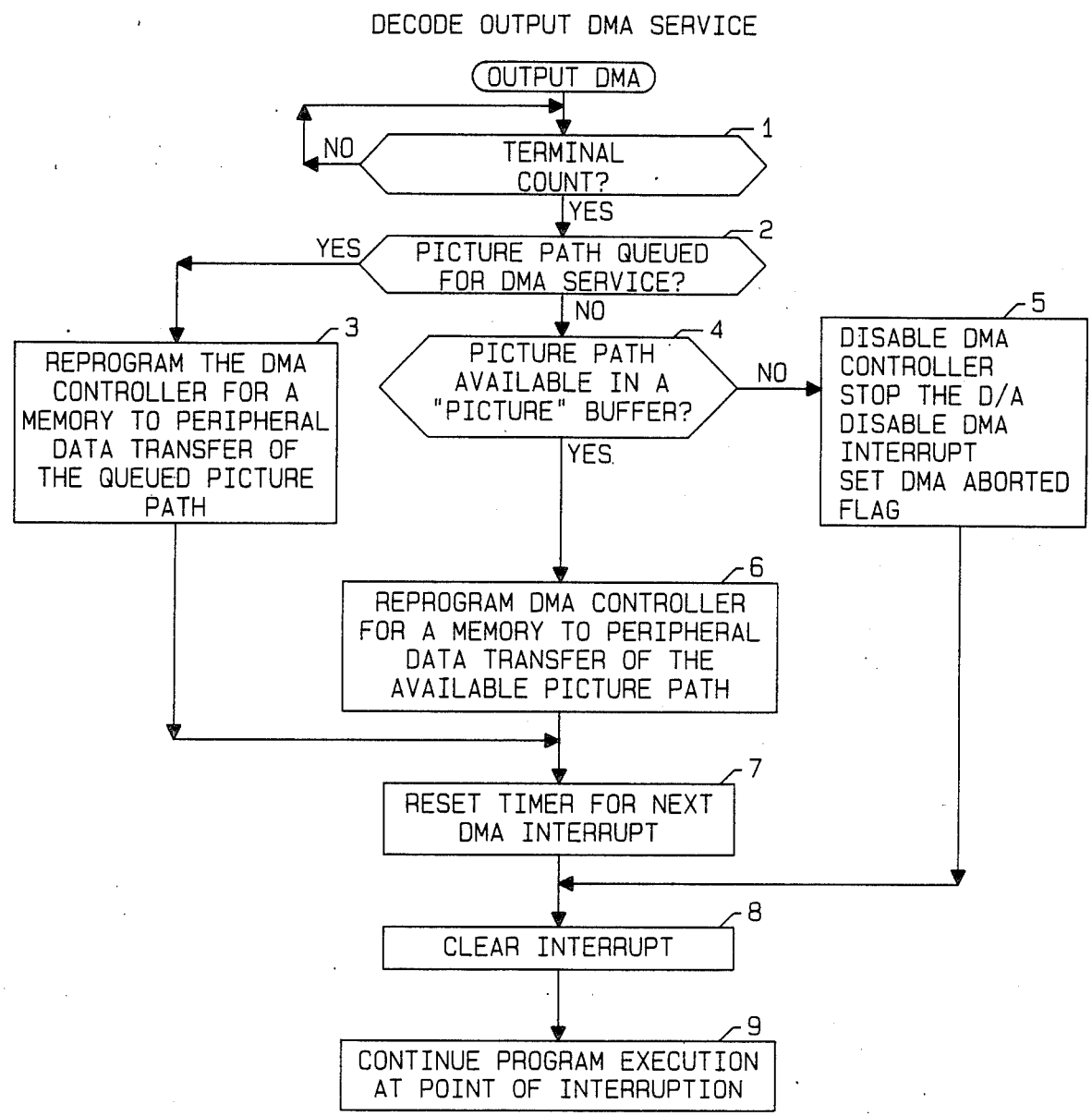
Figure 11:
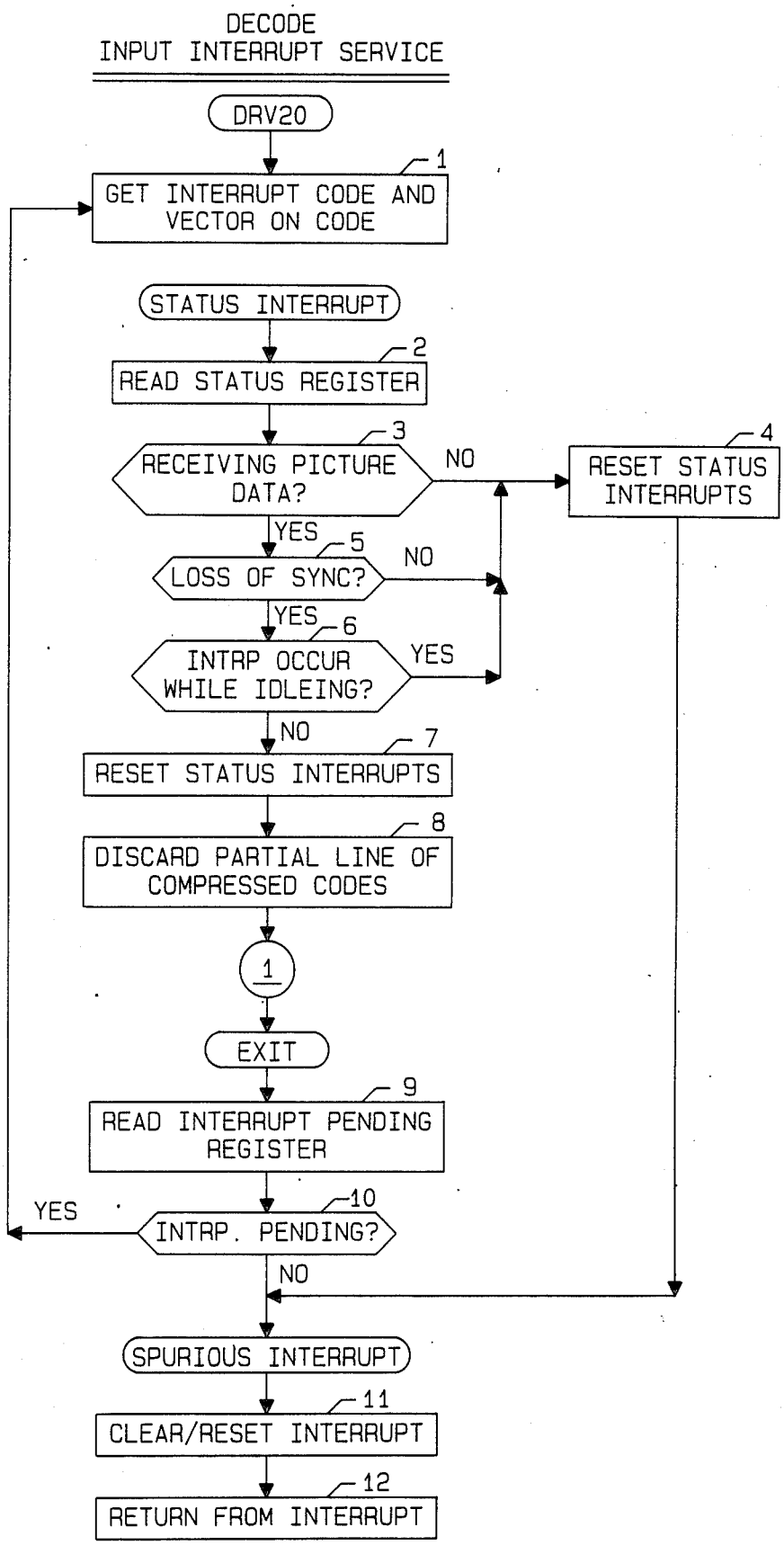
Figure 11:
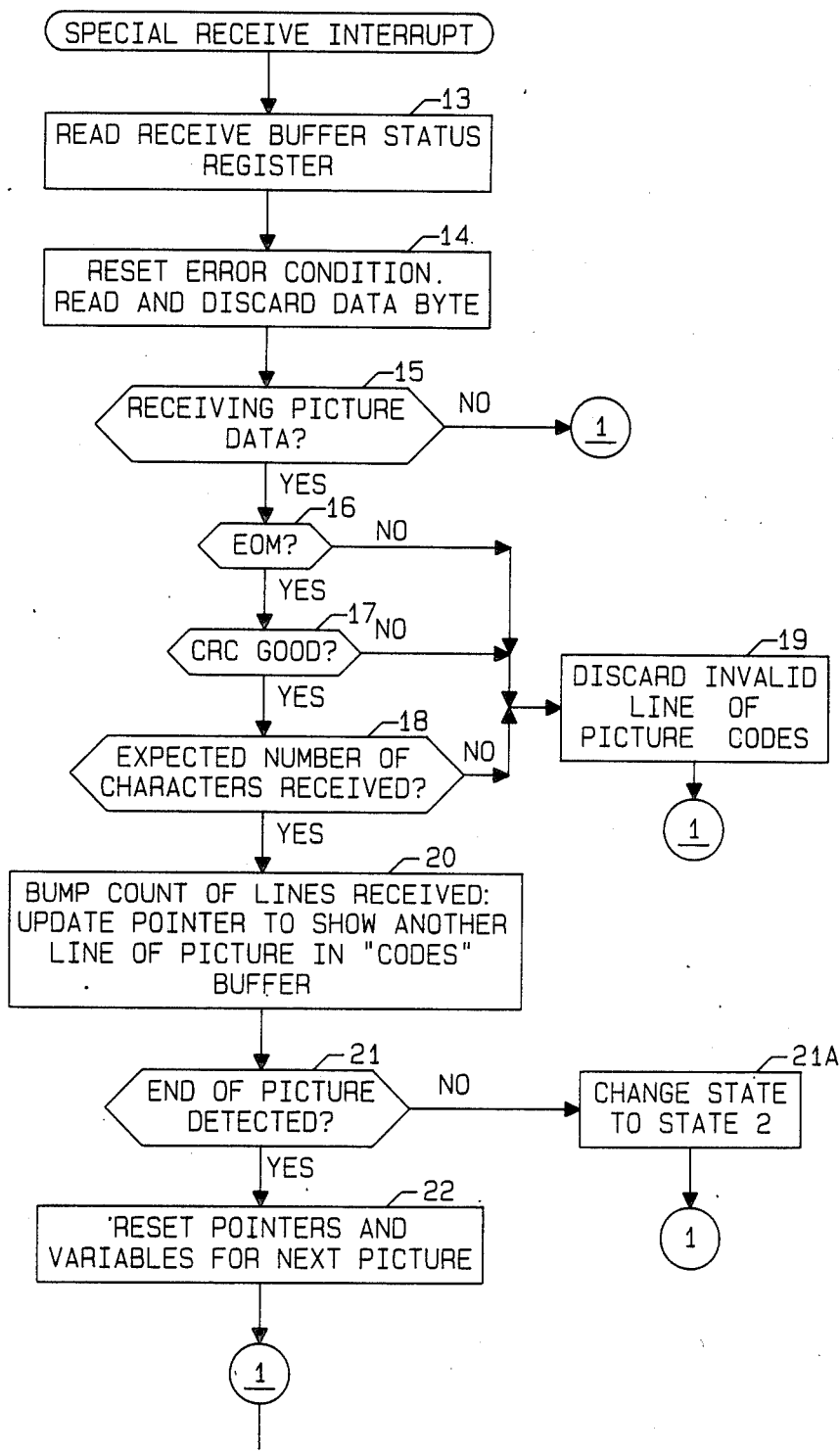
Figure 11:
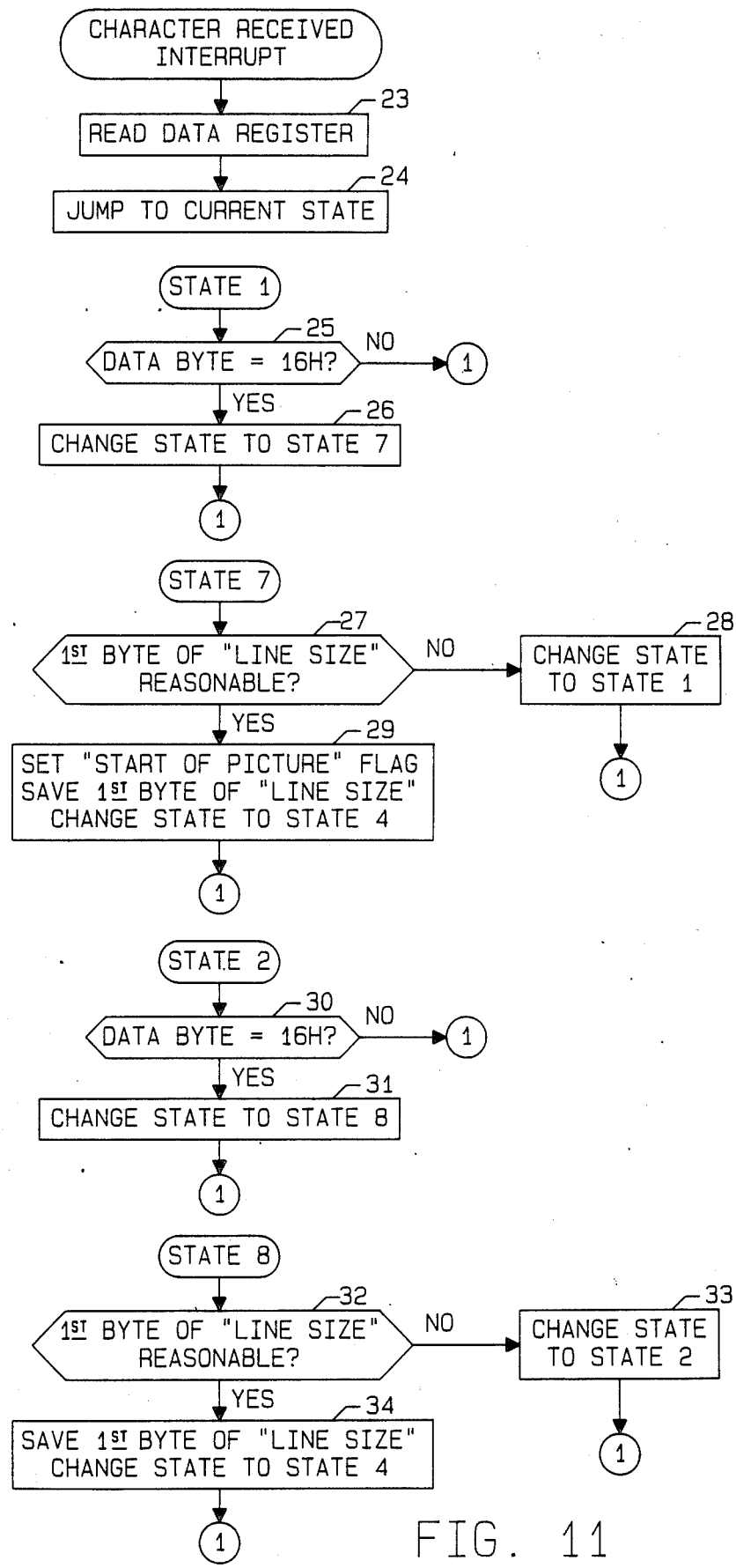
Figure 11:
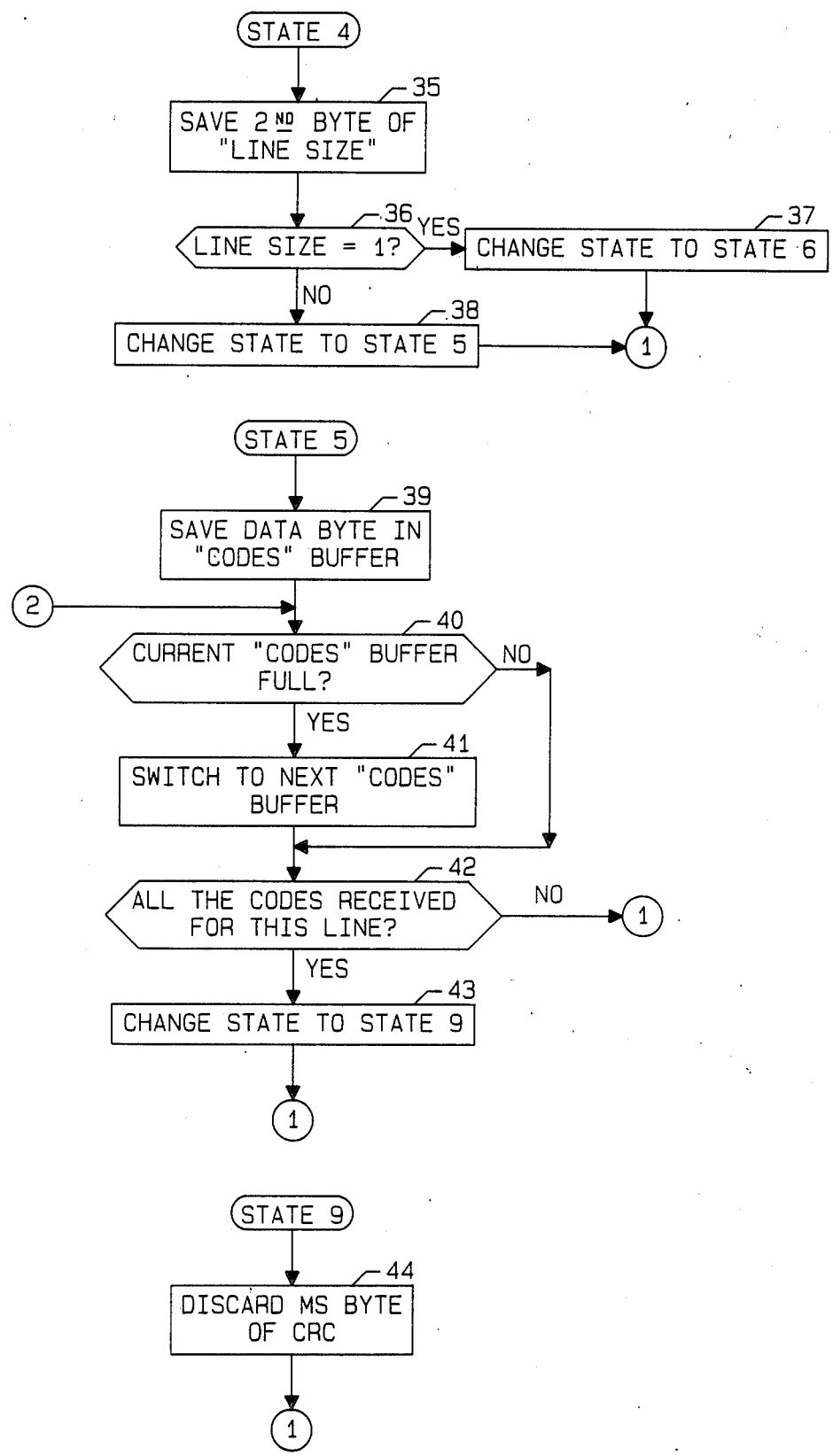
Figure 11:
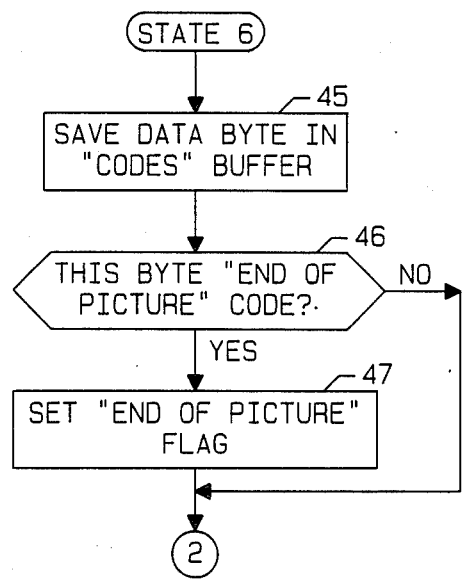

FIGS. 3(a) through 3(d) show the structure of the mode, run length codes, and fine resolution bytes which constitute portions of the encoded line of video information shown in FIGS. 2(a) and 2(b);

FIG. 4 is a diagram showing the four principal steps involved in the decoding method according to a second aspect of the present invention;

FIG. 5 is a flow chart showing the Output Interrupt Service Routine which is utilized in the encoding program;

FIG. 6 is a flow chart showing the main portion of the encoding program which carries out the steps illustrated in FIG. 1;

FIG. 7 is a flow chart showing the Input DMA (Direct Memory Access) Interrupt Service routine which is utilized in the encoding program;

FIG. 8 is a flow chart showing the Start A/D (Analog to Digital conversion) subroutine which is utilized in the encoding program;

FIG. 9 is a flow chart showing the main portion of the decoding program which carries out the steps illustrated in FIG. 4;

FIG. 10 is a flow chart showing the Output DMA (Direct Memory Access) Interrupt Service routine which is utilized in the decoding program; and FIG. 11 is a flow chart showing the Input Interrupt Service routine which is utilized in the decoding program.

Figure 12A:
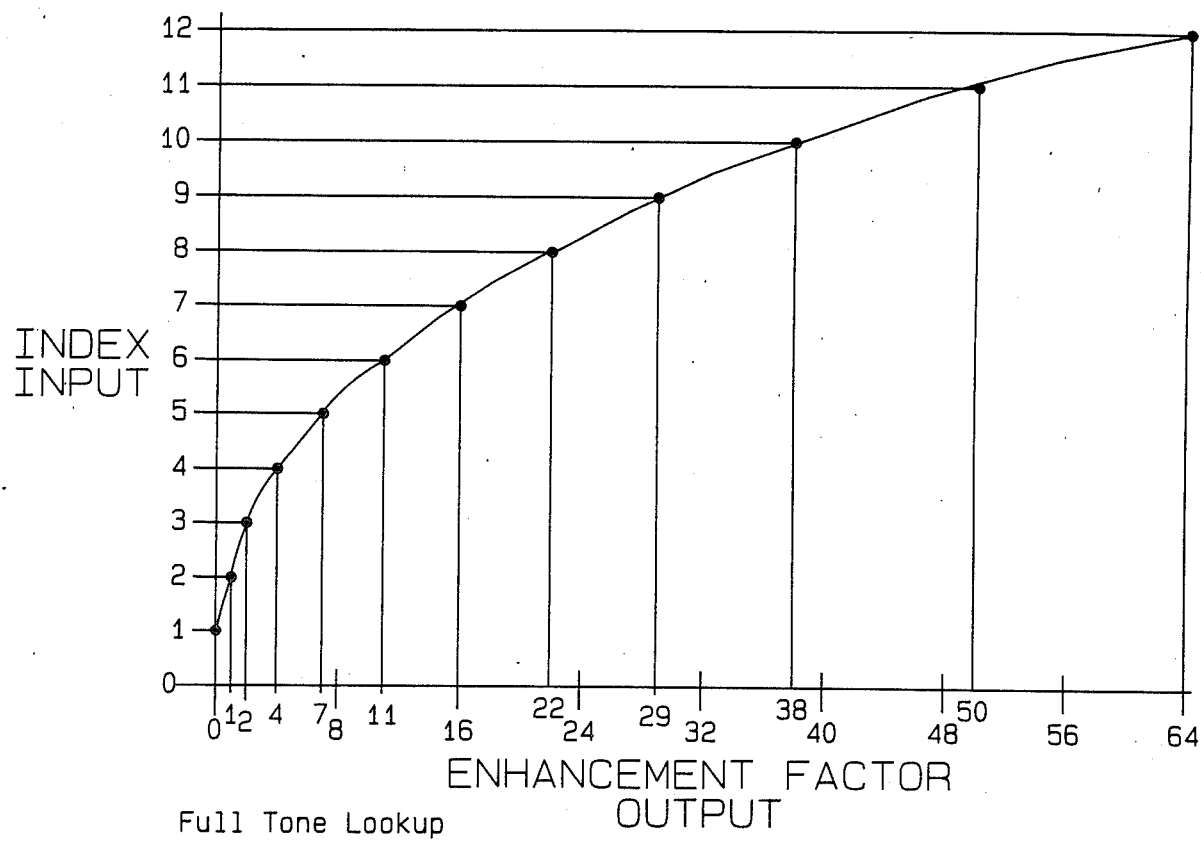

FIG. 12A is a full tone look-up enhancement factor table used in the method of the present invention.

Figure 12B:
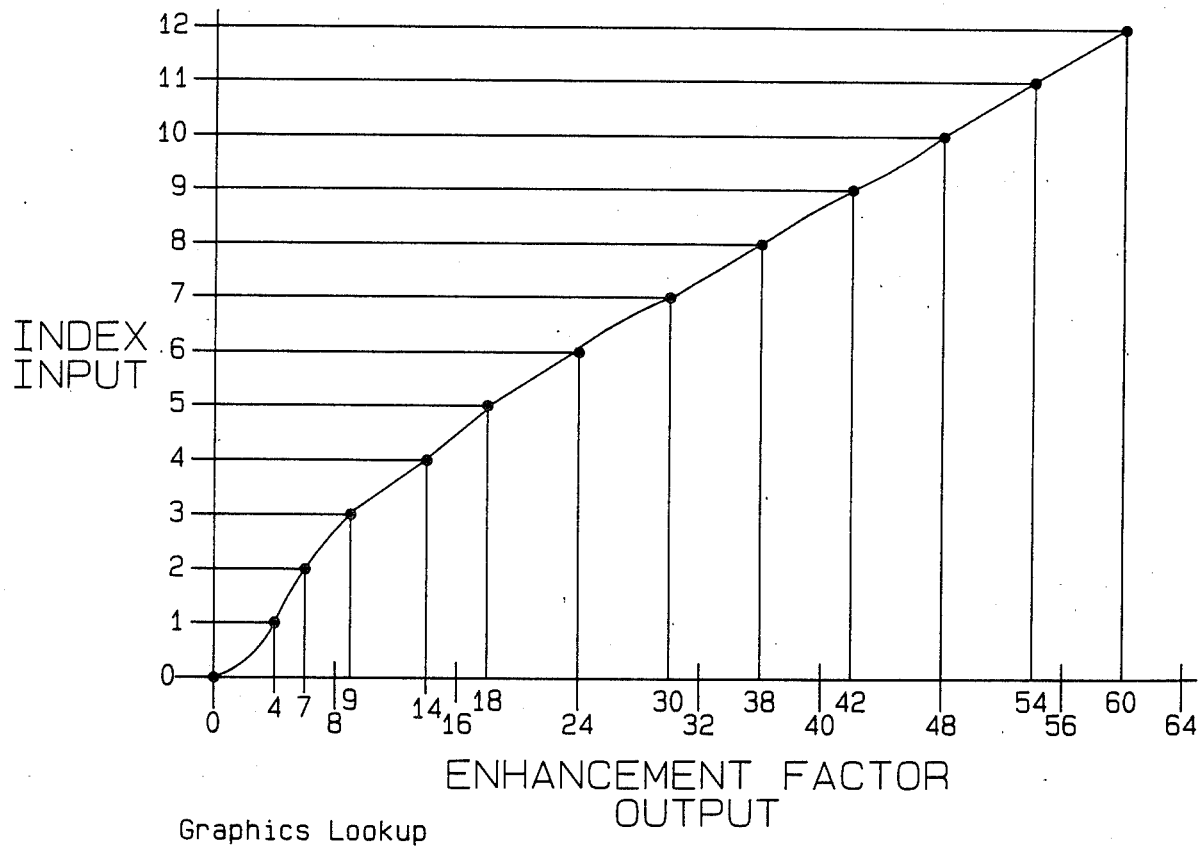

FIG. 12B is a graphic look-up enhancement factor table use in the method of the present invention.

SYSTEM DESCRIPTION

The method of the present invention is especially useful for (but not limited to) transmitting photographs and other graphic information from a facsimile transmitter to a remote facsimile receiver.

The encoding method (according to a first aspect of the invention) may be carried out utilizing the facsimile transmitter described in U.S. Pat. 4,547,810 entitled Portable Facsimile Transmitter and assigned to the assignee of the present application. In that transmitter, the encoding method can be carried out by means of a program in the microprocessor unit 33a conforming to that described in the instant application.

The decoding method (according to a second aspect of the invention) may be carried out utilizing the facsimile receiver described in copending U.S. patent application Ser. No. 06/741,290, filed June 4, 1985 now U.S. Pat. No. 4,661,361, entitled Laser Printing Facsimile Receiver, and assigned to the assignee of the instant application. The disclosure of said application is incorporated herein by reference, and a copy is annexed to this application. In that receiver, the decoding method can be carried out by means of a program in the central processing unit 64 conforming to that described in the instant application.

In a photograph there are usually significant areas which have the same darkness, and run length coding as well as double run length coding are employed to reduce redundancy by reducing the number of identical pixel byte (8 bits) sequences transmitted. These techniques are also utilized in the present invention.

The present invention, however, employs other data compression techniques to reduce the amount of digital information that is transmitted. These techniques involve:

(i) Truncating all bytes which describe the darkness of pixels to six bits, by dividing the numerical value of each byte by four and rounding up;

(ii) In each sequence of eight successive pixels, truncating the least significant three remaining bits of the bytes corresponding to each of the second, fourth, sixth and eighth pixels;

(iii) In each such sequence, truncating the least significant two remaining bits of the bytes corresponding to each of the third and seventh pixels.

The three most significant bits of each pixel are then run length encoded and (if applicable) double run length encoded, to provide a series of bytes in which (a) the three most significant bits of each byte are the three most significant bits of the first pixel in the corresponding run, and (b) the five least significant bits specify the length of the run (in the case of a single run length code) or the number of identical run length encoded bytes (in the case of a double run length code).

The three least significant remaining bits of the bytes corresponding to the first and fifth pixels and the one least significant remaining bit of each of the bytes corresponding to the third and seventh pixels (i.e. a total of eight bits) are assembled into a fine resolution byte, and all the fine resolution bytes are transmitted in a group as part of the encoded line of digital video information.

Thus this technique reduces the number of bits that must be transmitted (before application of the run length and double run length encoding techniques) for eight pixels from 64 to 32, providing a substantial reduction in data transmission time over that required for prior art encoding methods which employ run length and double run length encoding techniques only.

As shown in FIG. 1, a line of a photograph to be transmitted may be scanned and sampled to provide (for example) 1,901 pixels. In Step A, each pixel is converted to a corresponding digital byte.

In Step B, each byte has been truncated to six bits. Although numerical values are not shown in Step B, the truncation is accomplished by dividing the numerical value of each byte by four and rounding (if necessary) the result up to the nearest higher digital value.

A similar process is used to truncate the third and seventh bytes of each sequence of bytes corresponding to eight successive pixels, to remove an additional two bits therefrom. That is, the numerical values corresponding to the bytes of the third and seventh pixels are each divided by sixteen, with any remainder removed.

Similarly, the bytes corresponding to the second, fourth, sixth and eighth pixels of the sequence are truncated to remove a total of five bytes therefrom. That is, the numerical values corresponding to the bytes of the second, fourth, sixth and eighth pixels are each divided by thirty-two, with any remainder removed.

The result of the aforementioned truncations is shown in Step B of FIG. 1.

As shown in Step C, the most significant three bits of each pixel byte are then run length and double run length encoded, to provide a series of bytes in which the three most significant bits correspond to those of the first pixel in the corresponding run, and as previously mentioned (b) the five least significant bits specify the length of the run (in the case of a single run length code) or the number of identical run length encoded bytes (in the case of a double run length code).

As shown in Step D and previously described, the remaining (after truncation) eight least significant bits of the bytes corresponding to said group of eight pixels are assembled into a fine resolution byte which is transmitted as part of the encoded line of digital video information.

The structure of an encoded scan line of digital video information is shown in FIGS. 2(a) and 2(b). In a preferred embodiment of the invention, there are 1300 horizontal scan lines per encoded photograph (or other document), with 1,901 pixels per scan line and a scan rate of 2.4 lines per second. Digital information other than pixel information is also transmitted as part of the encoded line of digital video information.

At the beginning of each scan line is a line snych signal which is the number 16 in hexadecimal form. Following the line sync signal is a 16 bit line size signal which specifies the number of bytes in the line.

Following the line size signal is a mode byte (see FIG. 3(a)) which specifies:

i. Whether the individual line is full tone (i.e. a photograph) or a graphic image (this is specified only for transmissions including run length codes);

ii. Whether the code which specifies the location of each double run length code is of word length (16 bits) or byte length (8 bits); and iii. The number of double run length codes in the line (a maximum of 19 double run length codes per line in the preferred embodiment).

Following the mode byte is a series of up to 19 double run locator bytes, each of which specifies the location in the line of a corresponding double run length encoded byte.

Following the double run locator bytes is a series of run length encoded bytes (see FIG. 3(b) for an example) interspersed with double run length encoded bytes (see FIG. 3(c) for an example). If there are no run length codes in the line, the mode byte is followed by a series of bytes in which the three most significant bits are those of corresponding pixels, and the five least significant bits are zero.

Following the run length and double run length encoded bytes (or the aforementioned pixel bytes if there are no run length codes) are 238 fine resolution bytes (1,901 pixels per line divided by 8 pixels per fine resolution byte).

After the fine resolution bytes a standard checksum polynomial error detecting byte is provided. The symbol "CRC" shown in FIG. 2(b) is an abbreviation for Cyclic Redundancy Checksum.

At the receiver, the various portions of the encoded line are identified, and the (truncated) individual pixels are reconstructed from the run length code and double run length code information, to provide sequences of pixels wherein each sequence of eight pixels has the appearance shown in Step B of FIG. 1, a corresponding specific example being shown in Step E of FIG. 4, in which zero values have been re-inserted for the first and fifth bytes of the sequence.

As shown at Step F of FIG. 4, the four least significant bits of the third pel of the sequence (Pel C) are reconstructed by taking the average of the values of the first and fifth pels. In the example of FIG. 4, the hexadecimal value of the first pel is B4 whereas the hexadecimal value of the fifth pel is B8. Therefore, the average value is B6.

However, before this average value can be assigned to the third pel of the sequence (Pel C), the following verification process is performed:

1. The minimum allowable value for Pel C is determined by clearing the four least significant bits of the current value of Pel C to form the hexadecimal value B0;
2. The maximum allowable value for Pel C is determined by setting the four least significant bits of the current value of Pel C to 1, to form the hexadecimal value BF; and
3. The average value is compared to the minimum and maximum values determined as described above.

Since in the example shown the average value falls within the computed minimum and maximum values, Pel C is assigned the hexadecimal value B6.

Similarly, the value of the seventh pel in the sequence is assigned a value corresponding to the average of the fifth pel of the sequence and the first pel of the next succeeding sequence.

If the average value of the first and fifth pels used for the value of the third pel is less than the computed minimum allowable value for the third pel, then the minimum allowable value for Pel C is assigned as the value thereof. A similar procedure is followed for the seventh pel of the sequence.

If the average value of the first and fifth pels used for the value of the third pel is greater than the computed maximum allowable value for the third pel, then the maximum allowable value for Pel C is assigned as the value thereof. A similar procedure is followed for the seventh pel of the sequence.

In Step G of FIG. 4, the value of the second pel (Pel B) of the sequence is determined by taking the average of the values of the immediately preceding and succeeding pels and comparing this average value with the minimum and maximum allowable values for Pel B, determined in a manner similar to that by which the determination was made for Pel C, except that in the case of Pel B the five least significant bits are utilized for this purpose (rather than the four least significant bits as in the case of Pel C).

Clearing the five least significant bits of Pel B yields the minimum allowable hexadecimal value of A0; and setting the five least significant bits of Pel B to 1 yields the maximum allowable hexadecimal value of BF. As seen in Step G, the average of these values is the hexadecimal value B5, which falls within the computed minimum and maximum limits; therefore this value is assigned to Pel B. A similar procedure is followed for the fourth, sixth and eighth pels of each sequence, i.e. the value of each pel is determined by averaging the values of the immediately preceding and succeeding pels and comparing this average value with computed minimum and maximum allowable limits for the particular pel involved.

If the average value for the five least significant bits of the second pel is less than the smaller of the corresponding values of the first and third pels, then the smaller of said corresponding values is used for the five least significant bits of the second pel. A similar procedure is followed for the fourth, sixth and eighth pels of each sequence.

If the average value for the five least significant bits of the second pel is greater than the larger of the corresponding values of the first and third pels, then the larger of said corresponding values is used for the five least significant bits of the second pel. A similar procedure is followed for the fourth, sixth and eighth pels of each sequence.

The process is continued for all of the pixels in the line, until each pixel is specified by a reconstructed eight bit byte.

After all the pels in the line have been reconstructed into eight bit bytes, each pel in the line is enhanced via a table lookup algorithm, as shown in FIGS. 12a (for full tone mode) or 12b (for graphics mode).

Enhancement is used to sharpen edge transitions, i.e. black to white and white to black transitions. The enhancement lookup tables are constructed such that small differences in the values of contiguous pels remain small while larger differences are increased or accentuated to emphasize boundaries or color transitions.

In field tests it has been found that photographs transmitted utilizing the method of the present invention result in received images of quality which cannot be visually distinguished from those transmitted utilizing run length coding and double run length coding techniques alone; and that use of the method of the present invention results in a reduction of data transmission time (over the use of run length coding and double run length coding alone) typically in the range of 60% to 73%.

The manner in which the encode and decode programs accomplish the aforementioned steps will be more clearly understood from the following detailed description thereof.

DETAILED DESCRIPTION

Encoding Program Overview (FIGS. 5 to 8)

The encoding program which is used in the transmitter to input, digitize, encode and transmit picture data to a remote site, consists of four major segments, namely:

(A) Start A/D (FIG. 8)—This segment: (1) monitors for the carrier signal which indicates the start of the picture, (2) provides automatic gain control of the incoming signal, (3) searches for and verifies the presence of phasing pulses (see FIG. 10a of U.S. Pat. No. 4,547,810), and (4) initiates the Input DMA (Direct Memory Access) process.

(B) Input DMA (FIG. 7)—This is the DMA Interrupt Service Routine which controls the continuous DMA input of data into 64K byte "Picture" buffers. The data in these buffers is then made available to the Encode program.

(C) Encode (FIG. 6)—This segment is the main program which encodes the data in the "Picture" buffers. The encoded data is put into "Transmit" buffers. The data in these buffers is then made available to the DRV11 routine.

(D) DRV11 (FIG. 5)—This is the Output Interrupt Service Routine which is responsible for sending the data in the "Transmit" buffers to the receiver.

These program segments are described in detail below, with reference to the corresponding flow charts:

Start A/D (FIG. 8)

In Step 1 the analog to digital conversion process is disabled, and the automatic gain control ramping circuit is enabled. In Step 2 the program idles here until the carrier signal indicating that transmission is to be initiated is detected. The carrier signal may be generated by pressing a button on the transmitter, or upon receipt of a remotely generated transmit command.

In Step 3 the analog to digital conversion process is enabled and the video signal output (produced by the photosensor scanning the document containing the image to be transmitted) is sampled. In Step 4, if the digitized reading is greater than or equal to the hexadecimal value FC, which is the desired AGC (automatic gain control) value, then the program proceeds to Step 5; otherwise it proceeds to Step 6.

Step 5 increments the counter which counts the number of samples so far subjected to automatic gain control. In Step 6 if 5 consecutive readings are counted, the program proceeds to Step 8; otherwise it proceeds to Step 7. In Step 7, if the carrier signal is still present the program proceeds to Step 3; otherwise it returns to Step 1. In Step 8 ramping of the AGC circuit is stopped.

Steps 9 through 15 are used to search for a black pel value, which is the first pel of the phasing pulse train.

In Step 9, if the carrier signal is still present the program proceeds to Step 10; otherwise it returns to Step 1. Step 10 takes another sample of the video signal output corresponding to the next pel. In Step 11, if the value of the next pel corresponds to a black pel then the program proceeds to Step 16; otherwise it reverts to Step 12. At Step 12, if approximately 50 seconds have elapsed since the start of the search for the first black pel then the program proceeds to Step 13; otherwise it goes to Step 9. In Step 13, if the search loop for the first black pel has been executed twice then the program reverts to Step 1; otherwise it proceeds to Step 14. In Step 14, the AGC circuit is allowed to ramp down one step. In Step 15, if the next 2067 pels are less than or equal to the hex value FC, then the program goes to Step 9; otherwise it goes to Step 14.

Steps 16 through 22 are used to verify that a phasing pulse has been found. A phasing pulse consists of two black pulses sandwiching a line of white pels.

In Step 16, if the carrier signal is still present then the program proceeds to Step 17; otherwise it returns to Step 1. In Step 17, the next 200 video output readings are sampled and discarded. In Step 18, the next video output reading is sampled.

In Step 19, if the video output sample is the tenth white pel found at 200 pel intervals, then the program proceeds to Step 20; otherwise it goes to Step 16. At Step 20 the next 128 video output reading are sampled and discarded. At Step 21 the next video output reading is sampled.

In Step 22, if this reading corresponds to a black pel value, then the program proceeds to Step 23; otherwise it goes to Step 13. At Step 23 the presence of phasing pulses has been verified; therefore the Input DMA process is started.

Input DMA (FIG. 7)

Communication between the Input DMA processing program and the Encode main program is maintained through a common variable, DMA FLAG. The DMA interrupt is generated approximately every 1250 milliseconds so that the Input DMA routine can keep a constant check on the progress of the main program. A buffer of picture data is available every 12.5 seconds or every ten interrupt times.

At Step 1, if the DMA FLAG indicates that DMA input is in progress, then the program proceeds to Step 5; otherwise it goes to Step 2. In Step 2, if the DMA FLAG indicates that the main program is finished encoding the last buffer then the program proceeds to Step 3; otherwise it goes to Step 5. In Step 3, if a buffer of picture data is queued then the program proceeds to Step 4; otherwise it goes to Step 5. In Step 4, the picture buffer is made available to the main program by setting the DMA FLAG to "data buffer available".

In Step 5, if tone is still present then the program proceeds to Step 6; otherwise it goes to Step 16. In Step 6, if this is a modulo 10 interrupt then the program proceeds to Step 9; otherwise it goes to Step 7. At Step 7, the next interrupt is set to occur in 1250 milliseconds. Step 8 returns control to the interrupted program. The program then idles at Step 9 until the DMA terminal count is reached.

At Step 10, if the DMA FLAG indicates that the main program is finished encoding the last buffer, then the program proceeds to Step 11; otherwise it goes to Step 12. In Step 11, since the main program is idle, either a queued buffer (if available) or the buffer most recently input is made available to the main program, and control is transferred to Step 14. In Step 12, since the main program is currently encoding a picture buffer, this buffer must be queued. If a buffer is currently queued then the program goes to Step 20; otherwise it goes to Step 13. In Step 13 the picture buffer is put in the queue. In Step 14 the next buffer to be used to hold picture data is selected. In Step 15 the DMA controller is reprogrammed for another DMA write operation, and control is transferred to Step 7.

Steps 16 through 22 are used when loss of tone is detected, as at the end of a picture transmission.

In Step 16, the number of lines of picture in the last buffer is determined. In Step 17, if the DMA FLAG indicates that the main program is finished encoding the last available buffer then the program proceeds to Step 18; otherwise it goes to Step 22. In Step 18 the last picture buffer is made available to the main program by setting the DMA FLAG to "data buffer available". In Step 19, the next buffer to be used to hold picture data is selected. In Step 20, the DMA controller and the analog to digital conversion process are disabled. Step 21 returns control to the interrupted program. In Step 22, since the main program is currently encoding a picture buffer, processing of the next DMA interrupt will be handled by another program. Therefore, the DMA interrupt vector is modified to point to EOP (End Of Picture) PROCESSING.

Steps 23 through 27 are used to handle DMA interrupts after the end of the picture has been detected. In Step 23, if the DMA FLAG indicates that the main program is finished encoding the last available buffer, then the program proceeds to Step 24; otherwise it goes to Step 27. In Step 24, if a buffer of picture is queued then the program proceeds to Step 26; otherwise it goes to Step 25. Step 25 makes the last picture buffer available to the main program (i.e. the Encode program) by setting the DMA FLAG to "data buffer available", and control is then transferred to Step 27. Step 26 makes the queued picture buffer available to the Encode program.

Step 27 sets the next interrupt to occur in 200 milliseconds, and returns control to the interrupted program.

Encode (FIG. 6)

Step 1 is the initialization section of the Encode program, and sees to it that:
  (1) Program constants and variables are copied from ROM to RAM;
  (2) A STACK area is set up;
  (3) All interrupts on the Interrupt Controller (19b in FIG. 3 of U.S. Pat. No. 4,547,810) are masked, and interrupts used in the system are enabled when needed;
  (4) The SCC (Serial Communications Controller) is set up for SDLC (Synchronous Data Link Control) communications protocol;
  (5) Output interrupts are vectored to the Output Interrupt Service Routine via an appropriate output interrupt request;
  (6) The analog to digital converter which converts the video information derived from the photosensor which scans the document containing the image to be transmitted, is enabled ;
  (7) The PIT (Peripheral interface timer 58 in FIG. 3 of U.S. Pat. No. 4,547,810) internal counter 0 and internal counter 1 are initialized; and
  (8) The aforementioned output interrupt request is made the highest priority interrupt.

In Step 2, processing of a picture starts when the aforementioned transmission start tone is detected. This is followed by initiation of automatic gain control of the lineup signal and the initiation of the Input DMA process when the output video signal derived from the photosensor is detected. (See the Start A/D flow chart (FIG. 8) for a detailed description of this process).

At Step 3 the program idles until the first buffer of picture data is available. A buffer contains 30 lines of picture data.

Steps 4 through 12 are used to form the initial run length encoded bytes. Each run length encoded byte is formed by using a 3 bit run code (the three most significant bits of each pixel) and a 5 bit run length code (which allows encoding of runs of up to 32 identical three bit elements).

In Step 4 the pointers and variables used to form the run length encoded bytes are initialized. In Step 5 bits 7,6,5 (the three most significant bits) of the first pel are isolated and used as the reference run code, and the run length (value of the five least significant bits of the corresponding run length encoded byte) is set to 1.

In Step 6, the program is directed to Step 7 if the next pel run length encoded byte is identical to the reference run code; otherwise the program goes to Step 10. At Step 7 the run length is incremented by one. At Step 8 the program is directed to Step 9 if 32 consecutive run codes exist; otherwise the program goes to Step 11.

At Step 9 the maximum run length (32) for the first run length encoded byte has been obtained; therefore bits 7,6,5 (the most significant bits) of the next succeeding pel are isolated and used as the second reference run code.

At Step 10 the original reference run code and run length are combined and saved as a run length encoded byte. In Step 11, if 1901 pels have been scanned the program proceeds to Step 12; otherwise it goes to Step 6. At Step 12 the last reference run code and run length are combined and saved as a run length encoded byte. At Step 13, if the current Mode is full tone then the program proceeds to Step 22; otherwise it goes to Step 14.

Steps 14 through 27 are used to analyze the run length encoded bytes to determine if a change in Mode is indicated, i.e. from full tone to graphics or vice versa. If the current mode is graphics, then to switch to full tone Mode two consecutive lines of picture must be found that contain at least one run with a length greater than 15 whose run code is between 2 and 5—such a situation indicates that there is probably a substantial relatively gray area indicative of picture content rather than graphics.

If the current Mode is full tone, then to switch to graphics Mode sixteen consecutive lines of picture must be found that contain no runs with a length greater than 7 whose run code is between 1 and 6. Such a situation indicates that there is probably an absence of gray (as opposed to graphics) content.

In Step 14 the next run length encoded byte is retrieved from memory. In Step 15, if the run length is greater than or equal to 16, the program advances to Step 16; otherwise it jumps to Step 20. At Step 16, if the run code is 0 or 1, the program goes to Step 20; otherwise it goes to Step 17. At Step 17, if the run code is 6 or 7, the program is routed to Step 20; otherwise it goes to Step 18.

At Step 18, if this is the second consecutive line with gray (run code between 2 and 5) data, the program advances to Step 19; otherwise it goes to Step 20. In step 19 the Mode is switched to full tone, and control is transferred to Step 38. At Step 20, if all run pairs have been tested the program advances to Step 21; otherwise it reverts to Step 14. At Step 21 the counter of two consecutive lines is reset, and control is transferred to Step 28. In Step 22 the next run length encoded byte is retrieved from memory.

At Step 23, if the run length is greater than or equal to 8 the program goes to Step 24; otherwise it goes to Step 25. At Step 24, if the run code is 0 or 7 the program is routed to Step 25; otherwise it jumps to Step 38. At Step 25, if all run length encoded bytes have been examined the program advances to Step 26; otherwise it reverts to Step 22. At Step 26, if sixteen consecutive lines of black or white run length encoded bytes codes have been found, the program moves to Step 27; otherwise to goes to Step 38.

At Step 27 the Mode is switched to graphics. Steps 28 through 37 are used to smooth (i.e. filter) run length encoded bytes in a graphics line. Graphics runs are smoothed by combining the run lengths of all consecutive run length encoded bytes having pixel (most significant three bits) values equal to 0 or 1, and assigning to them a run code (value of three most significant bits of the corresponding run length encoded byte) of 0.

In Step 28 the next run length encoded byte is retrieved from memory. In Step 29 the counter of qualifying (having a value of 0 or 1) run codes is set to the run length just retrieved. In Step 30, if the run code is 0 or 1 the program advances to Step 33; otherwise it goes to Step 31. In Step 31 the run code and output of the counter of qualifying run lengths are combined to from an output run length encoded byte. In Step 32, if all run length encoded bytes have been examined the program proceeds to Step 38; otherwise it goes to Step 28.

At Step 33 the run code is set to 0. At Step 34, if all run length encoded bytes have been examined the program proceeds to Step 31; otherwise it goes to Step 35. In Step 35 the next run length encoded byte is processed. In Step 36, if the run code is 0 or 1 the program proceeds to Step 37; otherwise it goes to Step 31. At Step 37 the run length is added to the output of the counter of qualifying run lengths, and control is transferred to Step 34.

Steps 38 through 51 are used to form double run length encoded bytes.

In Step 38 the first (next) run length encoded byte is retrieved from memory. In Step 39 a counter (MATCH) of identical run length encoded bytes is initialized to 1. At Step 40, if the run length of the run length encoded byte being examined is equal to 32 the program proceeds to Step 43; otherwise it goes to Step 41. In Step 41 the byte value of the two identical run length encoded bytes and the output of the MATCH counter are saved. In Step 42, if all run length encoded bytes have been examined the program proceeds to Step 52; otherwise it goes to Step 38. In Step 43 the value of the run length encoded byte input to this step is saved as the reference value for double run length encoding purposes.

In Step 44, if all run length encoded bytes have been examined the program proceeds to Step 50; otherwise it goes to Step 45. At Step 45 the next run length encoded byte is retrieved. At Step 46, if this run length encoded byte is identical to the reference value for double run length encoding purposes, the program proceeds to Step 47; otherwise it goes to Step 41.

In Step 47 the MATCH counter is incremented by one. In Step 48, if all run length encoded bytes have been tested the program proceeds to Step 50; otherwise it goes to Step 49. At Step 49, if the next run length encoded byte has a value equal to the reference value for double run length encoding purposes, the program proceeds to Step 47; otherwise it goes to Step 50. In Step 50 the aforementioned reference value and the output of the MATCH counter are saved. In Step 51, if all run length encoded bytes have been examined the program proceeds to Step 52; otherwise it goes to Step 38.

Steps 52 through 59 are used to determine the location of double run length encoded bytes. In Step 52 the LOCATOR counter is initialized to 1, and the double run locator flag is initialized to a length of one byte.

At Step 53 the next run length encoded byte and corresponding MATCH counter output value are retrieved. At Step 54, if the Match counter output value is greater than or equal to 3, then this run qualifies as a double run and control is transferred to Step 55; otherwise the program goes to Step 58.

In Step 55 the value of the corresponding double run LOCATOR byte is saved. This locator byte indicates where a double run is positioned in the string of run length encoded bytes. At Step 56, if the output of the LOCATOR counter is greater than 255 the program proceeds to Step 57; otherwise it goes to Step 58. At Step 57 the double run locator flag is set to one word (two bytes or 16 bits), since it requires two bytes to store any double run length encoded byte location value greater than 255. At Step 58 the LOCATOR counter is incremented by one. At Step 59, if all run length encoded bytes have been tested the program proceeds to Step 60; otherwise it goes to Step 53.

Steps 60 through 65 are used to save the Mode byte, the line length bytes (two bytes or 16 bits) and the run length encoded bytes in the TRANSMIT buffer.

In Step 60 the total number of bytes for the line being processed is calculated. This total consists of the sum of:

(1) 1 Mode byte;
(2) 2 line length bytes;
(3) the number of double run locator bytes (each consisting of 8 or 16 bits as indicated by the Mode byte);
(4) the number of run length encoded bytes; and
(5) an additional 238 bytes of fine resolution bytes if the Mode byte indicates that a full tone is being transmitted. [no fine resolutions bytes are included if a graphic image is being transmitted ].

In Step 61 the most and least significant bits of the line length bytes are saved in the TRANSMIT buffer. In Step 62 the Mode byte is saved in the TRANSMIT buffer. [See FIG. 3(a) for a description of the MODE byte].

At Step 63, if there are any double run length encoded bytes the program proceeds to Step 64; otherwise it goes to Step 65. In Step 64 all the double run locator bytes are transferred to the TRANSMIT buffer. At Step 65 all the run length encoded bytes are transferred to the TRANSMIT buffer. In Step 66, if the Mode is full tone then control is transferred to Step 67; otherwise the program advances to Step 74.

Steps 67 through 73 are used to form the 238 fine resolution bytes that are included in a full tone line of codes. In Step 67 the loop control, N, is initialized to 1—ending at 1901 with an incremental step of 8. At Step 68 the byte value of Pel N is retrieved from the PICTURE buffer, and Bits 4, 3, and 2 are isolated from the PEL byte. These pel byte values are shifted to bit positions 7, 6, 5 and saved in the TEMP buffer.

At Step 69 the byte value of PEL N+2 is retrieved from the PICTURE buffer, and Bit 4 is isolated and logically combined (inclusive OR) with the value stored in the TEMP buffer. At Step 70 the byte value of Pel N+4 is retrieved from the PICTURE buffer, and Bits 4, 3 and 2 are isolated from the pel. These pel values are shifted to bit positions 3, 2 and 1 and logically combined (inclusive OR) with the value stored in the TEMP buffer.

In Step 71 the byte value of Pel N+6 is retrieved from the PICTURE buffer; Bit 4 is isolated, shifted to bit position 0, and then logically combined (inclusive OR) with the value stoed in the TEMP buffer. At Step 72 the value stored in the TEMP buffer is transferred to the TRANSMIT buffer. In Step 73 an incremental step is added to the loop control; and if 238 fine resolution pels have been formed the program proceeds to Step 74; otherwise it goes to Step 68.

Steps 74 through 77 are used to determine if an averaged line of picture data will be formed at the receiver. Averaging is initiated if the total number of bytes to be output from the TRANSMIT buffer is greater than a specified threshold. The algorithm in use employs two threshold levels:

(1) If at least 80 kilobytes of codes are queued for output, then one of every four lines is averaged; and
(2) if at least 120 kilobytes of codes are queued for output, then every other line is averaged.

At Step 74, if less than 80 kilobytes of codes are queued in the TRANSMIT buffer the program proceeds to Step 78; otherwise it goes to Step 75. At Step 75 the averaging flag is set to indicate that one in four picture lines can be averaged. At Step 76, if less than 120 kilobytes of codes are queued in the TRANSMIT buffer, the program proceeds to Step 78; otherwise it goes to Step 77. In Step 77 the averaging flag is set to indicate that every other line can be averaged. In Step 78 a pointer is updated to the next line in the PICTURE buffer, and the counter of lines encoded is incremented by one. At Step 79, if all 30 lines in the first buffer of picture data have been encoded the program proceeds to Step 80; otherwise it goes to Step 85.

Steps 80 through 84 are executed for the second and subsequent buffers (30 line groups) of picture data. The program monitors for the standard wedge and bar sequence (which occurs at the beginning of each transmission) during the first buffer (30 line group) of picture data.

In Step 80 the TRANSMIT buffer pointer, which is used by the Output Interrupt Service Routine (DRV11—FIG. 5), is updated to include the codes for the most recent line. In Step 81, if the output Interrupt process is active the program advances to Step 83; otherwise it goes to Step 82. At Step 82 the Output Interrupt process is started by sending the start of line character, also referred to as line synch pulses (16 in hexadecimal). Once this character is sent, subsequent interrupts will be handled by the Output Interrupt Service Routine.

In Step 83, if all 30 lines of the current PICTURE buffer have been encoded the program proceeds to Step 84; otherwise it goes to Step 95. In Step 84, if no more picture data is available the program proceeds to Step 98; otherwise it goes to Step 95.

Steps 85 through 94 are executed while the first buffer of picture data is being encoded. The program searches through this first picture data buffer (first 30 lines) for the wedge and bar pattern indicative of the beginning of the picture.

In Step 85, if all 30 lines of the first buffer of picture data have been encoded the program proceeds to Step 86; otherwise it jumps to Step 88. In Step 86, if no more picture data is available the program proceeds to Step 98; otherwise it goes to Step 87. In Step 87 the Output Interrupt process (DRV11 segment of the program) is started by sending the start of line character (hexadecimal 16). Once this character is sent, subsequent interrupts will be handled by the Output Interrupt Service Routine.

In Step 88, if 5 or less lines remain to be encoded the program proceeds to Step 89; otherwise it goes to Step 95. At Step 89, if the line length for this line is less than 1,536 bytes the program proceeds to Step 95. When the total number of bytes in the line is greater than 1,536, a line of bar pattern is assumed to have been found.

In Step 90, the wedge and bar pattern having been detected, the TRANSMIT buffer pointer is reset to discard all the codes which have previously been put into the TRANSMIT buffer. At Step 91, a "generate wedge and bar pattern" code is placed in the TRANSMIT buffer. This is the first code that the DECODE program in the receiver receives for this picture.

In Step 92, if no more picture data is available the program advances to Step 98; otherwise it goes to Step 93. In Step 93, since the bar pattern also encompasses the first six lines of the (30 line capacity of the) second buffer, the start pointer for this buffer is set to line 7. In Step 94 the Output Interrupt (DRV11) process is started by sending the start of line character. Once this character is sent, subsequent interrupts will be handled by the Output Interrupt Service Routine; control is transferred to Step 4.

Steps 95, 96 and 97 are used to test the averaging flag. At Step 95, if averaging is not in effect the program proceeds to Step 4; otherwise it goes to Step 96. At Step 96 the averaging flag is reset. If the next line of picture is to be averaged the program proceeds to Step 97; otherwise it goes to Step 4. In Step 97, since a line of picture data is to be averaged, the line is not yet encoded. Rather, a "form averaged line" code is placed in the TRANSMIT buffer; the PICTURE buffer pointer is advanced to skip this line; and control is transferred to Step 78.

Steps 98 through 101 are executed when the DMA Input Service Routine (FIG. 7) indicates end of picture; this occurs when loss of tone is detected.

In Step 98, the "end of picture" code is placed in the TRANSMIT buffer. At Step 99, if the Output Interrupt process is active the program proceeds to Step 101; otherwise it goes to Step 100. In Step 100 the Output Interrupt process is started by sending the start of line character. Once this character is sent, subsequent interrupts will be handled by the Output Interrupt Service Routine.

At Step 101, pointers and variables are reinitialized in preparation for the reception of the next picture, and control is transferred to Step 2.

DRV11 (FIG. 5)

In Step 1 the Interrupt Vector Register is read to determine the source of the interrupt. In Step 2, if the source of the interrupt is determined to be a Transmit Buffer Empty interrupt, control is transferred to Step 3; otherwise control is transferred to Step 7. In Step 3 a vector to the current program state is performed.

In Step 4, the next byte from the TRANSMIT buffer is fetched and output by the SCC (Serial Communications Controller). Step 5 tests if all the code bytes for this line of picture data have been sent, and if so continues program execution at Step 6, where the current state is changed to STATE2; otherwise the program proceeds to Step 7, which resets the interrupt and returns program control to the interrupted program.

Step 8 is executed while the program is in STATE2. This state prevents the occurrence of any further transmit interrupts for this line of codes. Stopping transmit interrupts will cause the SCC to send the Cyclic Redundancy Checksum which marks the end of a line, and causes the current state to be set to STATE3.

Steps 9, 10 and 11 are executed in STATE3. In Step 9 a test is made to determine if there are any other bytes in the TRANSMIT buffer waiting to be sent by the SCC, in which event control is transferred to Step 10; otherwise the program proceeds to Step 11.

Step 10 retrieves the two bytes of the line count (number of bytes in the line which follows) for the bytes which are to be sent next by the SCC. These two bytes are saved in a local variable and are used to control the transmit process while in STATE1. Step 11 changes the current state to STATE1 and transfers control to Step 7.

DECODING PROGRAM OVERVIEW

The decoding program is used in the receiver to input encoded picture data received from the transmitter via a communication link (telephone line, wireless, fiber optic cable, or the like), reform the original data base, convert the digital value of the reconstructed byte corresponding to each pixel or pel to its analog equivalent, and send this analog signal to a printer to produce a hard copy. The decoding program consists of the following three major segments:

(A) DRV10 (FIG. 11)—This is the Input Interrupt Service Routine which receives the encoded picture data and transfers it to "CODES" buffers. The data in these buffers is then made available to the Decode segment of the program.

(B) Decode (FIG. 9)—This is the main segment which reforms the original picture data base from the data in the "CODES" buffers. The reconstructed data is put into "PICTURE" buffers. The data in these PICTURE buffers is made available to the Output DMA segment of the program.

(C) Output DMA (FIG. 10)—This is the Output DMA Interrupt Service routine which controls the continuous DMA (Direct Memory Access) output of data from the PICTURE buffers to a printer.

These program segments are described in detail below, with reference to the corresponding flow charts:

Decode Input Interrupt Service (FIG. 11)

In Step 1 the interrupt vector code, which indicates the source of the interrupt, is read. Program execution continues under control of that code which handles the interrupt. The three sources of interrupt which are enabled and which are of interest here are:

(1) STATUS interrupt,
(2) SPECIAL RECEIVE CONDITION interrupt, and
(3) CHARACTER RECEIVED interrupt.

If any other source of interrupt occurs, it is considered invalid and spurious, and is ignored.

Steps 2 through 8 handle STATUS interrupts. In Step 2 the status register is read. In Step 3, if reception of data for a picture has begun, then program execution continues at Step 5; otherwise the program proceeds to Step 4. In Step 4, since the STATUS interrupt does not cause a loss of picture data, the STATUS interrupts are reset, and program execution continues at Step 11. In Step 5, if the status interrupt indicates loss of sync (that is, the receive SCC has lost synchronization with the transmit SCC), then program execution continues at Step 6; otherwise the program proceeds to Step 4.

At Step 6, if this STATUS interrupt occurs between picture lines, then program execution continues at Step 4; otherwise the program proceeds to Step 7. In Step 7 the STATUS interrupts are reset. In Step 8 the partial line of picture codes preceding resetting of the STATUS interrupts is discarded.

Steps 9 through 12 are the exit sequence, with Step 11 being the entry point for any invalid or spurious interrupts.

In Step 9 the Interrupt Pending Register is read. At Step 10, if another interrupt is pending, program execution continues at Step 1; otherwise the program proceeds to Step 11. In Step 11 the current interrupt is cleared and all the aforementioned interrupts are reset. At Step 12 program execution continues at the point of interruption.

Steps 13 through 22 handle SPECIAL RECEIVE CONDITION interrupts. In Step 13 the Receive Buffer Status Register is read. In Step 14 the error condition is reset, the Data Register is read, and its content is discarded. In Step 15, if reception of data for a picture has begun, program execution continues at Step 16; otherwise the program reverts to Step 9. In Step 16, if EOM (End of Message) is indicated, the program proceeds to Step 17; otherwise it goes to Step 19. At Step 17, if the CRC (Cyclic Redundancy Checksum) is good, the program proceeds to Step 18; otherwise it goes to Step 19.

At Step 18, if the expected number of bytes for this line of picture (as indicated by the value of the 16 bit line size signal) has been received, the program proceeds to Step 20; otherwise it goes to Step 19. In Step 19, upon receipt of a signal indicative of an invalid condition, the codes for the most recently received line of picture data are discarded; and program execution continues at Step 9.

At Step 20 the count of the number of lines received is incremented, and the pointer which maintains the position in the CODES buffer is updated to account for another line of picture data.

At Step 21, if the End Of Picture code has not been detected, the program proceeds to Step 21a; otherwise it goes to Step 22. In Step 21a the STATE variable, which is used by the CHARACTER RECEIVED interrupt handler, is updated to STATE2, and program execution continues at Step 9. In Step 22 variables and pointers are reset in preparation for the next picture. One important reset action is setting the STATE variable to STATE1. Program execution continues at Step 9.

Steps 23 through 47 handle CHARACTER RECEIVED interrupts.

In Step 23 the Data Register is read. Step 24 transfers program control to the section of code indicated by the STATE variable. Steps 25 and 26 are executed when the STATE variable has the value indicative of STATE1. At Step 25 the STATE1 condition is entered upon reception of the first code for a picture. Under this condition the program searches for the SOL (Start Of Line) code—hexadecimal 16—which is the first code of every line of picture. If the SOL code is found, the program proceeds to Step 26; otherwise the STATE variable remains unchanged and program execution continues at Step 9.

At Step 26, when the SOL code is found, the STATE variable is changed to STATE7; the SOL character is discarded and not put into the CODES buffer; and program execution continues at Step 9. Steps 27, 28 and 29 are executed in STATE7.

At Step 27, following the SOL code are 2 bytes (16 bit line length code) which indicate the number of bytes in the line of codes that follows. STATE7 ensures that the value of the first byte of this 2 byte code is reasonable, i.e. not greater than hexadecimal 08. If this byte is within reasonable limits, the program proceeds to Step 29; otherwise it goes to Step 28.

At Step 28, when the first line length byte has a value which is not reasonable, a search for the next SOL (Start Of Line) character is initiated. This is accomplished by changing the STATE variable to STATE1. Program execution continues at Step 9. At Step 29, since the first line length byte has a value within reasonable limits, the following actions are taken:

(1) The start of picture flag is set,
(2) This first byte is saved in a local variable not in the CODES buffer,
(3) The STATE variable is changed to STATE4, and
(4) Program execution continues at Step 9.

Step 30 and 31 are executed in STATE2. In Step 30 STATE2 is entered for the start of every line of picture data, except for the first line. STATE2 searches for the SOL code (hexadecimal 16). If SOL is found, the program proceeds to Step 31; otherwise the STATE variable remains unchanged and program execution continues at Step 9. In Step 31, since the SOL code was found, the STATE variable is changed to STATE4, and program execution continues at Step 9.

Steps 35 through 38 are executed in STATE4. In Step 35 the second byte of the line length field is saved in a local variable and not in the CODES buffer. In Step 36, if the line length is greater than 1 byte the program proceeds to Step 38; otherwise it goes to Step 37. In Step 37 the STATE variable is changed to STATE6 and program execution continues at Step 9. In Step 38 the STATE variable is changed to STATE5 and program execution continues at Step 9.

Steps 39 through 43 are executed in STATE5. In Step 39 the compressed picture code is saved in the CODES buffer. In Step 40, if the CODES buffer is full the program proceeds to Step 41; otherwise it goes to Step 42. At Step 41 the next CODES buffer is selected. At Step 42, if all the codes for this line of picture have not yet been received, the STATE variable remains unchanged and program execution continues at Step 9; otherwise the program goes to Step 43. In Step 43 the STATE variable is changed to STATE9 and program execution continues at Step 9.

Step 44 is executed for STATE9. At Step 44, since all the expected bytes for this line of picture have been received, the next byte will be the most significant byte of the CRC (Cyclic Redundancy Checksum); this byte is discarded, and program execution continues at Step 9.

The next interrupt that should occur is a SPECIAL RECEIVE CONDITION interrupt.

Steps 45, 46, and 47 are executed in STATE6. In Step 45 the program is in STATE6 because only one byte is expected for this line. This byte must be either a form averaged line code or an end of picture code. In Step 46, if this code is not the end of picture code, the program proceeds to Step 40; otherwise it goes to Step 47. At Step 47 the end of picture flag is set and program execution continues at Step 40.

Decode (FIG. 9)

Step 1 is the Initialization section, where the following events occur:

(1) Program constants and variables are moved from ROM to RAM;

(2) A STACK area is set up;

(3) All interrupts on the Interrupt Controller (Peripheral Interface Adapter 61 shown in FIG. 8 of U.S. patent application Ser. No. 06/741,290, filed June 4, 1985 and entitled Laser Printing Facsimile Receiver) are masked, and interrupts used in the system are enabled when needed;

(4) The SCC (Serial Communications Controller shown in FIG. 10 of the aforementioned U.S. patent application Ser. No. 06/741,290) is set up for SDLC (Synchronous Data Link Control) communications protocol;

(5) Input interrupts are vectored to the Input Interrupt Service Routine (DRV10, FIG. 11) via IRQ4 (Interrupt Request Queue module, in Peripheral Interface Adapter 61 shown in FIG. 8 of the aforementioned U.S. patent application Ser. No. 06/741,290);

(6) The Data Translation module (Analog to Digital Converter 63 shown in FIG. 8 of the aforementioned U.S. patent application Ser. No. 06/741,290) is initialized to the digital-to-analog conversion mode;

(7) Counter 0 and Counter 1 (contained within the Peripheral Interface Timer 62 shown in FIG. 8 of the aforementioned U.S. patent application Ser. No. 06/741,290) are initialized; and (8) IRQ4 is made the highest priority interrupt.

The first of two 64K byte PICTURE buffers is initialized with a white pel value; the second 64k PICTURE buffer is initialized with two phasing pulses, fourteen lines of wedge and fourteen lines of alternating black and white pels.

In Step 2 the program then idles until the Input Interrupt Service Routine (DRV10, FIG. 11) has buffered 160 lines of encoded picture data. In Step 3, after 160 lines of encoded picture data have been buffered, the first 64k byte PICTURE buffer is processed by the Output DMA segment of the program (FIG. 10). The Output DMA segment is started by:

(1) Programming channel 1 of the DMA Controller (the Peripheral Interface Adapter shown in FIG. 10 of the aforementioned U.S. patent application Ser. No. 06/741,290 as being coupled between the Central Processor Unit 64 and a digital-to-analog converter which drives the video output amplifier for the printer) for a Write transfer;

(2) Programming the analog-to-digital converter (shown as 63 in FIG. 8 of the aforementioned U.S. patent application Ser. No. 06/741,290) to continuously perform analog-to-digital conversions under control of the DMA Controller; and (3) Setting the PIT (Peripheral Interface Timer 62 shown in FIG. 8 of the aforementioned U.S. patent application Ser. No. 06/741,290) to interrupt in approximately 12.5 seconds.

The first PICTURE buffer is processed three times under control of the DMA Controller.

In Step 4, if the first coded picture data byte indicates that a wedge and bar is needed, the program proceeds to Step 6; otherwise it goes to Step 5. In Step 5 the first 29 lines of the second (64K bytes capacity) PICTURE buffer are reinitialized with a white pel value. The last line in the buffer contains phasing pulses. This buffer is processed by the DMA Controller.

In Step 6 the second PICTURE buffer is processed by the DMA Controller. In Step 7 a test is performed to determine if at least one line of coded picture data is available in the CODES buffer. The program idles here until data is available.

Steps 8 through 18 are used to initialize bit positions 7, 6, and 5 (the three most significant bits) of each of the 1,901 pels of the current line.

In Step 8 the next coded picture byte is retrieved from the CODES buffer. At Step 9, if the retrieved code is the terminator (End of Picture) code, then program execution continues at Step 67; otherwise the program goes to Step 10. In Step 10, if the retrieved code is the form averaged line code, then program execution continues at Step 71; otherwise the program goes to Step 11. In Step 11 the Mode of the line, the number of double run length encoded bytes, and the length (8 bits or 16 bits) of the double run length code locator bytes is obtained from the Mode byte. The format of the Mode byte is shown in FIG. 3(a). At Step 12 The double run locator codes are fetched from the CODES buffer and moved to a local buffer.

At Step 13 the next coded picture data byte is retrieved from the CODES buffer. In Step 14 the run code (three most significant bits of the corresponding pixels) and the run length code (number of repetitions—up to 32) are isolated from the run length encoded byte.

In Step 15, if the retrieved run length encoded byte is not a double run length encoded byte, program execution continues at Step 17; otherwise the program goes to Step 16. In Step 16 (applied to all double run length encoded bytes) the run length is multiplied by 32 to effectively convert the double run length encoded byte to 32 corresponding single run length encoded bytes. In Step 17 bits 7,6,5 of the current line in the current PICTURE buffer are initialized to the run code, using the replication factor (obtained by multiplying the run length by 32 as previously mentioned) as the loop control. At Step 18, if Bits 7, 6, 5 have been initialized for the 1,901 pel line, program execution continues at Step 19; otherwise the program goes to Step 13. In Step 19, if the Mode is Full Tone, program execution continues at Step 20; otherwise the program goes to Step 43.

Steps 20 through 26 use the fine resolution bytes (see FIG. 3(d)) to further define the 1901 pel values of the current line.

In Step 20 the pel N being reconstructed is initialized to pel 0 of the current line, and the loop control is set to 238 (the total number of fine resolution bytes). In Step 21 the next fine resolution byte is retrieved from the current CODES buffer. In Step 22 Bits 7, 6, 5 (the three most significant bits of the fine resolution byte) are isolated, shifted to bit positions 4, 3, 2 and logically combined (inclusive OR) with the byte value of pel N of the current line.

In Step 23 Bit 4 is isolated and logically combined (inclusive OR) with the byte value of pel N+2 of the current line. In Step 24 Bits 3, 2, 1 are isolated, shifted to bit positions 4, 3, 2 and logically combined (inclusive OR) with the byte value of Pel N+4 of the current line. In Step 25 Bit 0 is isolated, shifted to bit position 4 and logically combined (inclusive OR) with the byte value of Pel N+6 of the current line. In Step 26 N is incremented by 8. If 238 fine resolution bytes have not been processed, then program execution continues at Step 21; otherwise the program goes to Step 27.

Steps 27 through 34 are used to form the values for pels 2, 6, 10, 14 . . . 1,901. These pels have bit positions 7, 6, 5 set from the run length and double run length encoded bytes and bit position 4 set from the fine resolution bytes. Bit positions 3, 2, 1, 0 of pels 2, 6, 10, 14 . . . 1,901 are formed by averaging the values of the second next preceding pel and the second next succeeding pel. Both of these pels have been fully reconstructed by the run length and double run length codes and the fine resolution bytes.

In Step 27 the loop control, N, is initialized to start at Pel 2 of the current line and the incremental step for the loop is 4. In Step 28 the value for pel N is formed as the arithmetic average of the value of Pel N−2 and the value of Pel N+2. In Step 29 the minimum value for pel N is formed by clearing bit positions 3, 2 of pel N; and the maximum value is formed by setting bit positions 3, 2 of Pel N to 1. If the average value is greater than the minimum value, program execution continues at Step 31; otherwise the program goes to Step 30. At Step 30, since the average value is less than the minimum value, Pel N is set to the minimum value; and program execution continues at Step 34.

In Step 31, if the average value is less than the maximum value, program execution continues at Step 33; otherwise the program goes to Step 32. In Step 32, since the average value is greater than the maximum value, the value of Pel N is set to the maximum value; and program execution continues at Step 34. At Step 33, since the average value is greater than the minimum and less than the maximum, Pel N is set to the average value.

At Step 34 the loop control, N, is incremented by 4. If all the indicated pels for the current line have fully formed values, then program execution continues at Step 35; otherwise the program goes to Step 28.

Steps 35 through 42 are used to provide the five missing least significant bits of the byte values for all the odd numbered pels. These pels only have bit positions 7, 6, 5 set from the run length encoded and double run length encoded bytes. Bit positions 4, 3, 2, 1, 0 of the indicated pels are formed by averaging the values of the preceding pel and the succeeding pel. Both of these (preceding and succeeding) pels have been fully formed by the previously executed averaging algorithm.

In Step 35 the loop control, N, is initialized to start at pel 1 of the current line and the incremental step for the loop is 2. At Step 36 the value for Pel N is formed as the arithmetic average of the value of Pel N−1 and the value of Pel N+1. At Step 37 the minimum value for Pel N is formed by clearing bit positions 4, 3, 2 of Pel N; and the maximum value for Pel N is formed by setting bit positions 4, 3, 2 of pel N to 1. If the average value is greater than the minimum value, program execution continues at Step 39; otherwise the program goes to Step 38. In Step 38, since the average value is less than the minimum value, Pel N is set to the minimum value; and program execution continues at Step 42. In Step 39, if the average value is less than the maximum value, program execution continues at Step 41; otherwise the program proceeds to Step 40. At Step 40, since the average value is greater than the maximum value, Pel N is set to the maximum value; and program execution continues at Step 42. In Step 41, since the average value is greater than the minimum value and less than the maximum value, Pel N is set to the average value.

At Step 42 the loop control, N, is incremented by 2. If all the indicated pels for the current line have fully formed values, program execution continues at Step 43; otherwise the program goes to Step 36.

Steps 43 through 54 are used to enhance a fully formed line of picture data by "curving" the byte values thereof to improve gray scale rendition.

In Step 43 the loop control, N, is initialized to pel 0 of the current line and the incremental step is 1. In Step 44 the difference between Pel N and Pel N+1 is calculated. In Step 45, if this difference is positive, program execution continues at Step 47; otherwise the program goes to Step 46, where the absolute value of the difference is determined. At Step 47 the (absolute value of the) difference is divided by 4 to form an index into the Full Tone and Graphics lookup tables (shown in FIGS. 12a and 12b).

In Step 48, if the index is less than or equal to 12, program execution continues at Step 50; otherwise the program goes to Step 49 where, since the index is greater than 12, it is set to 12. This is the largest index for a 13 element lookup table. Step 50 reads the (Full Tone or Graphics) lookup table using the index to obtain an enhancement factor. The Full Tone lookup table is used if the line has been set by the Mode byte to full tone mode; otherwise the Graphics lookup table is used.

At Step 51, if the difference value determined in Step 44 is positive, program execution continues at Step 53; otherwise the program proceeds to Step 52. In Step 52, since the difference value is negative, the enhancement factor is negated. In Step 53 the value of Pel N+1 is saved as that of Pel N, and the enhancement factor is added to pel N+1. At Step 54 the loop control, N, is incremented by 1. If all the indicated pels for the current line have been enhanced, then program execution continues at Step 55; otherwise the program goes to Step 44. At Step 55, if an averaged line is to be formed, then program execution continues at Step 64; otherwise the program goes to Step 56.

In Step 56, if the Output DMA Service Routine (FIG. 10) has taken the available data in the current PICTURE buffer, then program execution continues at Step 57; otherwise the program goes to Step 58. In Step 57 the variables used to keep track of space available and position within the current PICTURE buffer are updated. In Step 58, if the current PICTURE buffer is full, program execution continues at Step 60; otherwise the program goes to Step 59. At Step 59 The pointer to the current line in the PICTURE buffer is saved as a marker to the last formed picture line; the position in the PICTURE buffer where the next line will be formed is saved as the current line pointer; and program execution continues at Step 7.

Steps 60 through 63 are used to queue the pointers which cannot yet be accepted by the Output DMA Service Routine, to a full PICTURE buffer.

The program idles at Step 60 until there is no queued picture data waiting to be processed by the Output DMA Service Routine (FIG. 10). In Step 61 the pointers and variables associated with the current (64K byte capacity) PICTURE buffer are moved to a queued buffer area that is accessible to the Output DMA Service Routine. In Step 62 the other (64K byte capacity) PICTURE buffer is made the current PICTURE buffer. Since the Output DMA Service Routine may still be in progress on data in the newly assigned current PICTURE buffer, the program idles at Step 63 until the DMA Service Routine completely finishes with the current PICTURE buffer. Program execution then continues at Step 7.

Steps 64, 65, and 66 create an averaged line of picture data.

In Step 64 the loop control, N, is initialized to pel 0 of the current line and the incremental step is 1. In Step 65 the value of Pel N is the arithmetic average of the value of Pel N in the line marked as the last line and Pel N in the line marked as the current line. At Step 66 the loop control, N, is incremented by 1. If all the pels for the averaged line have been formed, then program execution continues at Step 56; otherwise the program goes to Step 65.

Steps 67 through 70 reset conditions for reception of the next picture. Step 67 resets variables for reception of the next picture. The program idles at Step 68 until the Output DMA Service Routine indicates that its function has been completed. At Step 69, if reception of the next picture is in progress, then program execution continues at Step 70; otherwise the program returns to Step 1. In Step 70 a delay of approximately 30 seconds is initiated to allow the receiver to clear the last picture; and program execution continues at Step 1.

Steps 71 through 76 do the setup necessary to form an averaged line. In Step 71, if there is space for only one line of picture data in the current PICTURE buffer, program execution continues at Step 73; otherwise the program goes to Step 72. At Step 72 the pointer to the current line in the PICTURE buffer is saved as the marker to where the averaged line will be formed; the position in the PICTURE buffer where the next line will be formed is saved as the current line pointer; and program execution continues at Step 7.

The program idles at Step 73 until there is no queued picture data waiting to be processed by the Output DMA Service Routine. At Step 74 the pointers and variables associated with the current PICTURE buffer are moved to a queued buffer area that is accessible to the Output DMA Service Routine. At Step 75 a flag is set to indicate that an averaged line is to be formed, and the other Picture buffer is made the current PICTURE buffer. At Step 76, since Output DMA Service may still be in progress on data in the newly assigned current PICTURE buffer, the program idles here until the Output DMA Service Routine completely finishes with the current PICTURE buffer. Program execution then continues at Step 7.

Output DMA (FIG. 10)

In Step 1 the DMA STATUS register is read and the program idles until the data stored in the register indicates that terminal count for DMA Channel 1 has been reached. In Step 2, if picture data has been queued for processing by the Output DMA Service Routine, the program proceeds to Step 3; otherwise the program goes to Step 4.

At Step 3 the DMA Controller is reprogrammed to initiate a memory to peripheral (i.e. to the Peripheral Interface Adapter which couples the Central Processing Unit 64 to the video output amplifier which drives the printer, as shown in FIG. 10 of of the aforementioned U.S. patent application Ser. No. 06/741,290) data transfer of the queued picture data; and program control is transferred to Step 7. At Step 4, if picture data is available in one of the two PICTURE buffers, the program proceeds to Step 6; otherwise it goes to Step 5.

In Step 5, since no picture data is available for processing by the Output DMA Service Routine, the Output DMA process must be aborted. This is accomplished by:
(1) Disabling the DMA Controller,
(2) Aborting the digital to analog conversion process,
(3) Disabling the DMA interrupt,
(4) Setting the DMA abort flag, and
(5) Transferring program control to Step 8.

At Step 6 the DMA Controller is reprogrammed to initiate a memory to peripheral data transfer of the available picture data. In Step 7 the Peripheral Interface Timer (shown as 62 in FIG. 8 of the aforementioned U.S. patent application Ser. No. 06/741,290) is reset to interrupt at the end of the Output DMA process just initiated. In Step 8 the DMA interrupt is cleared; and in Step 9 control is returned to the point of interruption.

We claim:
1. A method for transmitting and receiving digital video information derived from the scanning of an image to provide a digital code wherein a series of data bits define the values of corresponding pixels of said image, comprising the steps of:
(a) providing six data bits defining the value of each pixel;
(b) run length encoding the three most significant data bits of each pixel in a series of eight bit bytes, so that wherever the same three most significant bits appear in up to thirty-two adjacent pixels, said three most significant bits are transmitted once, followed by a five bit code indicating the number of times the same three most significant bits are repeated in succeeding pixels;
(c) run length encoding said eight bit bytes, so that wherever the same bits appear in up to thirty-two adjacent ones of said eight bit bytes, each corresponding eight bit byte is transmitted once, followed by a code indicating the number of times the same eight bit byte is repeated, to provide a double run length encoded series of bits defining the values of the three most significant bits of each pixel;

(d) combining with said double run length encoded series of bits a series of eight bit fine resolution bytes equal in number to one-eighth of the number of pixels, one of said fine resolution bytes being provided for each group of eight adjacent pixels, three bits of each of said fine resolution bytes corresponding to the three least significant bits of the value of a first pixel of said group, so that each first pixel has six fully defined bits, another three bits of each of said fine resolution bytes corresponding to the three least significant bits of the value of a second pixel of said group, so that each second pixel has six fully defined bits, said first and second pixels being spaced from each other by three other pixels, one bit of each of said fine resolution bytes corresponding to the fourth most significant bit of a third pixel intermediate between and spaced by the same number of pixels from one of said first pixels and one of said second pixels, so that each third pixel has four fully defined bits, another bit of each of said fine resolution bytes corresponding to the fourth most significant bit of a fourth pixel intermediate between and spaced by the same number of pixels from one of said first pixels and one of said second pixels, so that each fourth pixel has four fully defined bits;

(e) combining with said double run length encoded series of bits and said series of eight bit fine resolution bytes (i) a synchronizing code of predetermined length defining the beginning of each scanned line, and (ii) an error detecting code, to provide a composite bit train;

(f) transmitting said composite bit train to a remote receiving station;

(g) at said receiving station, decoding said composite bit train to regenerate (i) first and second pixel values each having six fully defined bits, (ii) third and fourth pixel values each having four fully defined bits, and (iii) other pixel values each having three fully defined bits;

(h) computing an eight bit first average value of each pair of adjacent regenerated first and second pixels;

(i) comparing each said first average value with the value of the third or fourth pixel intermediate between the corresponding first and second pixels and having four fully defined bits, and (1) when the four most significant bits of said first average value are identical to the four most significant bits of the value of said intermediate third or fourth pixel, setting the four least significant bits of said intermediate third or fourth pixel equal to the four least significant bits of said first average value respectively, (2) when the value of the four most significant bits of said first average value is less than that of the four most significant bits of the value of said intermediate third or fourth pixel, setting the four least significant bits of said intermediate third or fourth pixel at the minimum possible value thereof, and (3) when the value of the four most significant bits of said first average value is greater than that of the four most significant bits of the value of said intermediate third or fourth pixel, setting the four least significant bits of said intermediate third or fourth pixel at the maximum possible value thereof, thereby providing each of said third and fourth pixels with eight bit values;

(j) computing an eight bit second average value of each pair of adjacent regenerated pixels having eight bit values, said pixels having eight bit values comprising said first, second, third and fourth pixels;

(k) comparing each said second average value with the value of each other pixel having three fully defined bits and disposed intermediate between the corresponding regenerated pixels having eight bit values, and (1) when the three most significant bits of said second average value are identical to the three most significant bits of the value of said intermediate other pixel having three fully defined bits, setting the five least significant bits of the value of said intermediate other pixel having three fully defined bits, equal to the five least significant bits of said second average value, (2) when the value of the three most significant bits of said second average value is less than the value of the three most significant bits of said intermediate other pixel having three fully defined bits, setting the five least significant bits of said intermediate other pixel having three fully defined bits at the minimum possible value thereof, and (3) when the value of the three most significant bits of said second average value is greater than the value of the three most significant bits of said intermediate other pixel having three fully defined bits, setting the five least significant bits of said intermediate other pixel having three fully defined bits at the maximum possible value thereof, thereby providing each of said other pixels having three fully defined bits, with eight bit values.

2. The method according to claim 1, comprising the additional step of, at said receiving station, processing said error detecting code to detect an error in the transmission of a portion of said bit train corresponding to a particular scanned line and, in response to the detection of said error, replacing the values of the pixels in said particular scanned line by the average of the values of the corresponding pixels of the immediately preceding and succeeding scanned lines.

3. The method according to claim 1, wherein said video information comprises a predetermined number of pixels per scanned line, comprising the additional step of, at said receiving station, counting the number of said fine resolution bytes in each scanned line, generating an error signal when said number deviates from one-eighth of said predetermined number of pixels, and, in response to said error signal, replacing the values of the pixels in said particular scanned line by the average of the values of the corresponding pixels of the immediately preceding and succeeding scanned lines.

4. A method for transmitting and receiving digital video information derived from the scanning of an image to provide a digital code wherein a series of data bits define the values of corresponding pixels of said image, comprising the steps of:

(a) providing a first predetermined number of data bits defining the value of each pixel;

(b) run length encoding a second predetermined number, less than said first predetermined number, of the most significant data bits of each pixel in a series of bytes, so that wherever the same second predetermined number of most significant bits appear in adjacent pixels, said second predetermined number of most significant bits are transmitted once, followed by a code comprising a third predetermined number of bits and indicating the number of times the same second predetermined number of most significant bits are repeated in succeeding pixels;

(c) run length encoding said bytes, so that wherever the same bits appear in adjacent ones of said bytes, each corresponding byte is transmitted once, followed by a code indicating the number of times the same byte is repeated, to provide a double run length encoded series of bits defining the values of said second predetermined number of most significant bits of each pixel;

(d) combining with said double run length encoded series of bits a series of fine resolution bytes equal in number to a predetermined fraction of the number of pixels, one of said fine resolution bytes being provided for each group of a fourth predetermined number of adjacent pixels, a fifth predetermined number of bits, equal to the difference between said first and second predetermined numbers, of each of said fine resolution bytes corresponding to all of the least significant bits of the value of a first pixel of said group, so that each first pixel has said first predetermined number of fully defined bits, another fifth predetermined number of bits of each of said fine resolution bytes corresponding to all of the least significant bits of the value of a second pixel of said group, so that each second pixel has said first predetermined number of fully defined bits, said first and second pixels being spaced from each other by a predetermined number of pixels, one bit of each of said fine resolution bytes corresponding to the next most significant bit, after said second predetermined number of most significant bits, of a third pixel intermediate between and spaced by the same number of pixels from one of said first pixels and one of said second pixels, so that each third pixel has one more than said second predetermined number of fully defined bits, another bit of each of said fine resolution bytes corresponding to the next most significant bit, after said second predetermined number of most significant bits, of a fourth pixel intermediate between and spaced by the same number of pixels from one of said first pixels and one of said second pixels, so that each fourth pixel has one more than said second predetermined number of fully defined bits;

(e) combining with said double run length encoded series of bits and said series of fine resolution bytes (i) a synchronizing code of predetermined length defining the beginning of each scanned line, and (ii) an error detecting code, to provide a composite bit train;

(f) transmitting said composite bit train to a remote receiving station;

(g) at said receiving station, decoding said composite bit train to regenerate (i) first and second pixel values each having said first predetermined number of fully defined bits, (ii) third and fourth pixel values each having one more than said second predetermined number of fully defined bits, and (iii) other pixel values each having said second predetermined number of fully defined bits;

(h) computing a first average value of each pair of adjacent regenerated first and second pixels, having said first predetermined number of bits;

(i) comparing each said first average value with the value of the third or fourth pixel intermediate between the corresponding first and second pixels and having one more than said second predetermined number of fully defined bits, and (1) when the most significant bits of said first average value, numbering one more than said second predetermined number of most significant bits, are identical to the corresponding most significant bits of the value of said intermediate third or fourth pixel, setting the remaining least significant bits of said intermediate third or fourth pixel equal to the corresponding remaining least significant bits of said first average value respectively, (2) when the value of the most significant bits, numbering one more than said second predetermined number of most significant bits, of said first average value is less than that of the corresponding most significant bits of the value of said intermediate third or fourth pixel, setting the remaining least significant bits of said intermediate third or fourth pixel at the minimum possible value thereof, and (3) when the value of the most significant bits, numbering one more than said second predetermined number of most significant bits, of said first average value is greater than that of the corresponding most significant bits of the value of said intermediate third or fourth pixel, setting the remaining least significant bits of said intermediate third or fourth pixel at the maximum possible value thereof, thereby providing each of said third and fourth pixels with said first predetermined number of bit values;

(j) computing a second average value of each pair of adjacent regenerated pixels having said first predetermined number of bit values, said second average value comprising said first predetermined number of bits, said pixels having said first predetermined number of bit values comprising said first, second, third and fourth pixels;

(k) comparing each said second average value with the value of each other pixel having said second predetermined number of fully defined bits and disposed intermediate between the corresponding regenerated pixels having said first predetermined number of bit values, and (1) when the most significant bits of said second average value, numbering said second predetermined number of most significant bits, are identical to the corresponding most significant bits of the value of said intermediate other pixel having said second predetermined number of fully defined bits, setting the remaining least significant bits of the value of said intermediate other pixel having said second predetermined number of fully defined bits, equal to the corresponding least significant bits of said second average value, (2) when the value of the most significant bits of said second average value, numbering said second predetermined number of most significant bits, is less than the value of the corresponding most significant bits of said intermediate other pixel having said second predetermined number of fully defined bits, setting the remaining least significant bits of said intermediate other pixel having said second predetermined number of fully defined bits at the minimum possible value thereof, and (3) when the value of the most significant bits of said second average value, numbering said second predetermined number of most significant bits, is greater than the value of the corresponding most significant bits of said intermediate other pixel having said second predetermined number of fully defined bits, setting the remaining least significant bits of said intermediate other pixel having said second predetermined number of fully defined bits at the maximum possible value thereof, thereby providing each of said other pixels having said second predetermined number of fully defined bits, with said first predetermined number of bit values.

5. A method for encoding digital video information derived from the scanning of an image to provide a digital code wherein a series of data bits define the values of corresponding pixels of said image, comprising the steps of:

(a) providing a first predetermined number of data bits defining the value of each pixel;

(b) encoding a second predetermined number, less than said first predetermined number, of the most significant data bits of each pixel; and (c) combining in a bit train with said encoded most significant data bits a series of fine resolution bytes equal in number to a predetermined fraction of the number of pixels, one of said fine resolution bytes being provided for each group of a fourth predetermined number of adjacent pixels, a fifth predetermined number of bits, equal to the difference between said first and second predetermined numbers, of each of said fine resolution bytes corresponding to all of the least significant bits of the value of a first pixel of said group, so that each first pixel has said first predetermined number of fully defined bits, another fifth predetermined number of bits of each of said fine resolution bytes corresponding to all of the least significant bits of the value of a second pixel of said group, so that each second pixel has said first predetermined number of fully defined bits, said first and second pixels being spaced from each other by a predetermined number of pixels, one bit of each of said fine resolution bytes corresponding to the next most significant bit, after said second predetermined number of most significant bits, of a third pixel intermediate between and spaced by the same number of pixels from one of said first pixels and one of said second pixels, so that each third pixel has one more than said second predetermined number of fully defined bits, another bit of each of said fine resolution bytes corresponding to the next most significant bit, after said second predetermined number of most significant bits, of a fourth pixel intermediate between and spaced by the same number of pixels from one of said first pixels and one of said second pixels, so that each fourth pixel has one more than said second predetermined number of fully defined bits.

6. The method according to claim 5, comprising the additional steps of:

(d) transmitting said composite bit train to a remote receiving station;

(e) at said receiving station, decoding said composite bit train to regenerate (i) first and second pixel values each having said first predetermined number of fully defined bits, (ii) third and fourth pixel values each having one more than said second predetermined number of fully defined bits, and (iii) other pixel values each having said second predetermined number of fully defined bits;

(f) computing a first average value of each pair of adjacent regenerated first and second pixels, having said first predetermined number of bits; and (g) comparing each said first average value with the value of the third or fourth pixel intermediate between the corresponding first and second pixels and having one more than said second predetermined number of fully defined bits, and (1) when the most significant bits of said first average value, numbering one more than said second predetermined number of most significant bits, are identical to the corresponding most significant bits of the value of said intermediate third or fourth pixel, setting the remaining least significant bits of said intermediate third or fourth pixel equal to the corresponding remaining least significant bits of said first average value respectively, (2) when the value of the most significant bits, numbering one more than said second predetermined number of most significant bits, of said first average value is less than that of the corresponding most significant bits of the value of said intermediate third or fourth pixel, setting the remaining least significant bits of said intermediate third or fourth pixel at the minimum possible value thereof, and (3) when the value of the most significant bits, numbering one more than said second predetermined number of most significant bits, of said first average value is greater than that of the corresponding most significant bits of the value of said intermediate third or fourth pixel, setting the remaining least significant bits of said intermediate third or fourth pixel at the maximum possible value thereof, thereby providing each of said third and fourth pixels with said first predetermined number of bit values.

7. The method according to claim 6, comprising the additional steps of:

(h) computing a second average value of each pair of adjacent regenerated pixels having said first predetermined number of bit values, said second average value comprising said first predetermined number of bits, said pixels having said first predetermined number of bit values comprising said first, second, third and fourth pixels; and (i) comparing each said second average value with the value of each other pixel having said second predetermined number of fully defined bits and disposed intermediate between the corresponding regenerated pixels having said first predetermined number of bit values, and (1) when the most significant bits of said second average value, numbering said second predetermined number of most significant bits, are identical to the corresponding most significant bits of the value of said intermediate other pixel having said second predetermined number of fully defined bits, setting the remaining least significant bits of the value of said intermediate other pixel having said second predetermined number of fully defined bits, equal to the corresponding least significant bits of said second average value, (2) when the value of the most significant bits of said second average value, numbering said second predetermined number of most significant bits, is less than the value of the corresponding most significant bits of said intermediate other pixel having said second predetermined number of fully defined bits, setting the remaining least significant bits of said intermediate other pixel having said second predetermined number of fully defined bits at the minimum possible value thereof, and (3) when the value of the most significant bits of said second average value, numbering said second predetermined number of most significant bits, is greater than the value of the corresponding most significant bits of said intermediate other pixel having said second predetermined number of fully defined bits, setting the remaining least significant bits of said intermediate other pixel having said second predetermined number of fully defined bits at the maximum possible value thereof, thereby providing each of said other pixels having said second predetermined number of fully defined bits, with said first predetermined number of bit values.

8. A method for encoding digital video information derived from the scanning of an image to provide a digital code wherein a series of data bits define the values of corresponding pixels of said image, comprising the steps of:

(a) providing a first predetermined number of most significant data bits and a second predetermined number of less significant data bits defining the value of each pixel;

(b) run length encoding said most significant data bits of each pixel; and (c) combining in a bit train with said run length encoded most significant data bits a series of fine resolution bytes, each of said fine resolution bytes containing one or more less significant data bits of selected ones of a group of adjacent pixels.

9. A method for decoding digital video information derived from the scanning of an image and in the form of a digital code wherein a series of data bits define the values of corresponding pixels of said image, a first predetermined number of most significant data bits being run length encoded, and a second predetermined number of less significant data bits being encoded in the form of a series of fine resolution bytes, each of said fine resolution bytes containing one or more less significant data bits of selected ones of a group of adjacent pixels, said decoding method comprising the steps of:

(a) reconstructing the most significant data bits of each pixel by decoding said run length encoded data bits;

(b) decoding each of said fine resolution bytes to provide one or more less significant data bits of each of said selected pixels;

(c) reconstructing the encoded data bits of said selected pixels by combining the reconstructed most significant bits of each selected pixel with corresponding decoded less significant bits thereof, at least some of said selected pixels having a greater number of reconstructed data bits than other pixels interleaved therewith;

(d) determining the values of any remaining less significant bits of particular ones of said selected pixels by, for each such particular pixel, averaging the values of other selected pixels preceding and succeeding said particular pixel by the same number of intermediate pixels; and (e) determining the values of the less significant bits of all other pixels by, for each such other pixel, averaging the values of selected pixels preceding and succeeding said other pixel by the same number of intermediate pixels.

10. The decoding method according to claim 9, comprising the additional step of verifying the average values determined in steps (d) and (e), and rejecting each average value which falls outside the range of the values used in computing the same.

11. The decoding method according to claim 10, comprising the additional step of substituting for each rejected average value, the value of the pixel used in determining the average value, which pixel value is closest to the rejected average value.

12. The decoding method according to claim 11, comprising the additional step of enhancing the decoded pixel values to improve gray scale rendition of the corresponding image by increasing relatively large differences between the values of adjacent pixels as compared to relatively small differences therebetween.

* * * * *